(12) United States Patent
Takagi et al.

(10) Patent No.: US 8,279,657 B2
(45) Date of Patent: Oct. 2, 2012

(54) NONVOLATILE MEMORY ELEMENT AND NONVOLATILE MEMORY DEVICE

(75) Inventors: Takeshi Takagi, Kyoto (JP); Zhiqiang Wei, Osaka (JP); Takeki Ninomiya, Osaka (JP); Shunsaku Muraoka, Osaka (JP); Yoshihiko Kanzawa, Osaka (JP)

(73) Assignee: Panasonic Corporation, Osaka (JP)

( * ) Notice: Subject to any disclaimer, the term of this patent is extended or adjusted under 35 U.S.C. 154(b) by 186 days.

(21) Appl. No.: 12/990,323

(22) PCT Filed: Dec. 4, 2009

(86) PCT No.: PCT/JP2009/006622
§ 371 (c)(1),
(2), (4) Date: Oct. 29, 2010

(87) PCT Pub. No.: WO2010/064446
PCT Pub. Date: Jun. 10, 2010

(65) Prior Publication Data
US 2011/0051500 A1    Mar. 3, 2011

(30) Foreign Application Priority Data
Dec. 4, 2008 (JP) .................................. 2008-309383

(51) Int. Cl.
*G11C 11/00* (2006.01)
(52) U.S. Cl. ...................................... 365/148; 365/158
(58) Field of Classification Search .................. 365/148, 365/158, 163, 171
See application file for complete search history.

(56) References Cited

U.S. PATENT DOCUMENTS 5,994,757 A    11/1999    Ichikawa et al.
6,473,332 B1    10/2002    Ignatiev et al.
7,426,128 B2 *  9/2008    Scheuerlein .................... 365/63
(Continued)

FOREIGN PATENT DOCUMENTS

JP    7-263647    10/1995
(Continued)

OTHER PUBLICATIONS

International Search Report issued Mar. 2, 2010 in International (PCT) Application No. PCT/JP2009/006622.
(Continued)

*Primary Examiner* — Vu Le
(74) *Attorney, Agent, or Firm* — Wenderoth, Lind & Ponack, LLP

(57) ABSTRACT

Provided is a nonvolatile memory element which is capable of performing a stable resistance change operation at a low breakdown voltage.

A nonvolatile memory element (100) includes: a first electrode layer (103); a second electrode layer (105); and a variable resistance layer (104) which is placed between the electrodes (103 and 105), and whose resistance state reversibly changes between a high resistance state and a low resistance state based on a polarity of a voltage applied between the electrodes (103 and 105). The variable resistance layer (104) is formed by stacking a first oxide layer (104a) including an oxide of a first transition metal and a second oxide layer (104b) including an oxide of a second transition metal which is different from the first transition metal. At least one of the following conditions is satisfied: (1) a dielectric constant of the second oxide layer (104b) is larger than a dielectric constant of the first oxide layer (104a); and (2) a band gap of the second oxide layer (104b) is smaller than a band gap of the first oxide layer (104a).

12 Claims, 21 Drawing Sheets

U.S. PATENT DOCUMENTS

| | | | |
|---|---|---|---|
| 2004/0235247 A1 | 11/2004 | Hsu et al. | |
| 2004/0245557 A1 | 12/2004 | Seo et al. | |
| 2005/0207265 A1 | 9/2005 | Hsu et al. | |
| 2005/0247921 A1 | 11/2005 | Lee et al. | |
| 2007/0008773 A1* | 1/2007 | Scheuerlein | 365/161 |
| 2007/0114587 A1 | 5/2007 | Seo et al. | |
| 2007/0205456 A1 | 9/2007 | Lee et al. | |
| 2007/0267675 A1 | 11/2007 | Cho et al. | |
| 2007/0290186 A1 | 12/2007 | Bourim et al. | |
| 2008/0006907 A1 | 1/2008 | Lee et al. | |
| 2008/0048164 A1 | 2/2008 | Odagawa | |
| 2008/0083918 A1 | 4/2008 | Aratani et al. | |
| 2008/0117664 A1 | 5/2008 | Kinoshita et al. | |
| 2009/0097300 A1 | 4/2009 | Ishihara et al. | |
| 2010/0172170 A1 | 7/2010 | Tamai et al. | |
| 2010/0177555 A1* | 7/2010 | Shimakawa et al. | 365/148 |

FOREIGN PATENT DOCUMENTS

| | | |
|---|---|---|
| JP | 2004-349689 | 12/2004 |
| JP | 2004-363604 | 12/2004 |
| JP | 2005-317976 | 11/2005 |
| JP | 2006-40946 | 2/2006 |
| JP | 2007-180202 | 7/2007 |
| JP | 2007-235142 | 9/2007 |
| JP | 2007-300082 | 11/2007 |
| JP | 2007-311798 | 11/2007 |
| JP | 2008-16854 | 1/2008 |
| JP | 2008-21750 | 1/2008 |
| WO | 2007/013174 | 2/2007 |
| WO | 2008/142919 | 11/2008 |
| WO | 2009/154266 | 12/2009 |

OTHER PUBLICATIONS

K. Kinoshita et al., "*Lowering the Switching Current of Resistance Random Access Memory Using a Hetero Junction Structure Consisting of Transition Metal Oxides*", Japanese Journal of Applied Physics, Sep. 15, 2006, vol. 45, No. 37, pp. L991-L994.

I.G. Beak et al. "*Highly Scalable Non-volatile Resistive Memory using Simple Binary Oxide Driven by Asymmetric Unipolar Voltage Pulses*", Tech. Digest IEDM 2004.

Masayuki Fujimoto et al., "*High-Speed Resistive Switching of TiO2/ TiN Nano-Cystalline Thin Film*", Japanese Journal of Applied Physics, vol. 45, No. 11, 2006, pp. L310-L312.

K. Kinoshita et al., "*Bias polarity dependent data of resistive random access memory consisting of binary transition metal oxide*", Applied Physics Letters, vol. 89, 103509, 2006.

J. McPherson et al., "*Proposed Universal Relationship Between Dielectric Breakdown and Dielectric Constant*", IEDM 2002.

Masayuki Terai et al., "*Effect of ReRAM-Stack Asymmetry on Read Disturb Immunity*", IEEE CFP09RPS-CDR 47th Annual International Reliability Physics Symposium, Montreal, 2009.

* cited by examiner

FIG. 2
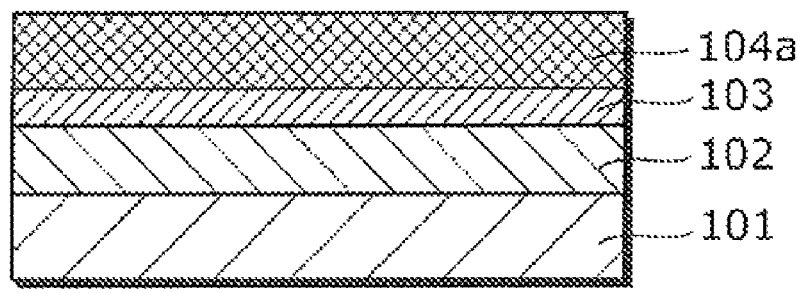
(a)
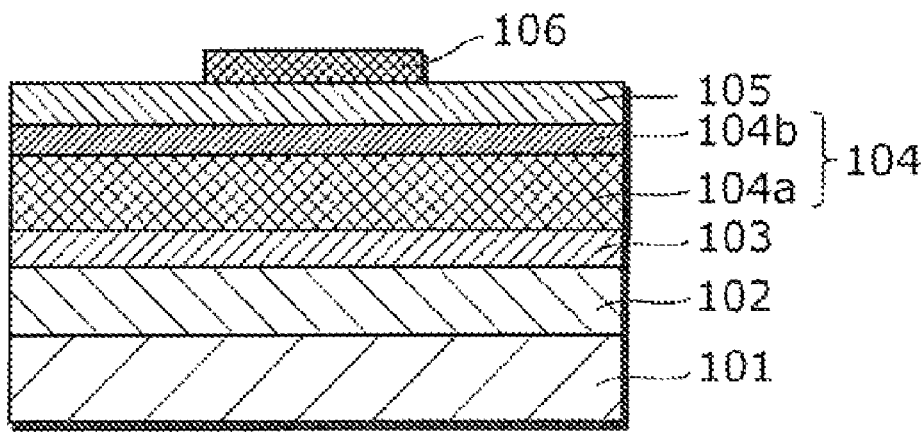
(b)
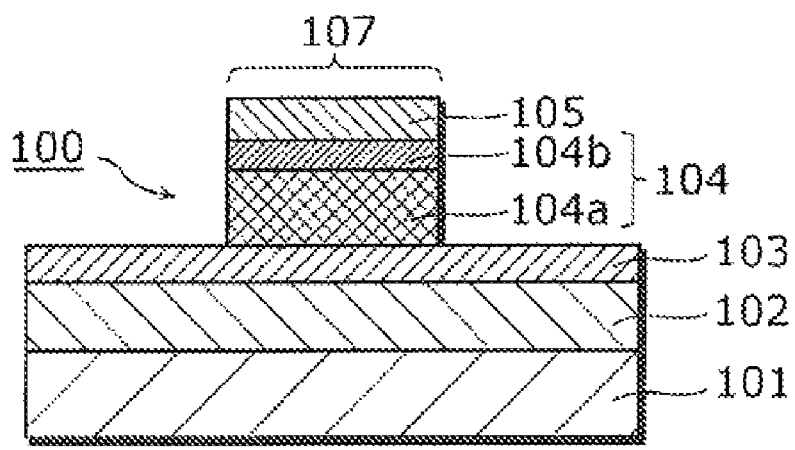
(c)

FIG. 22
(a) 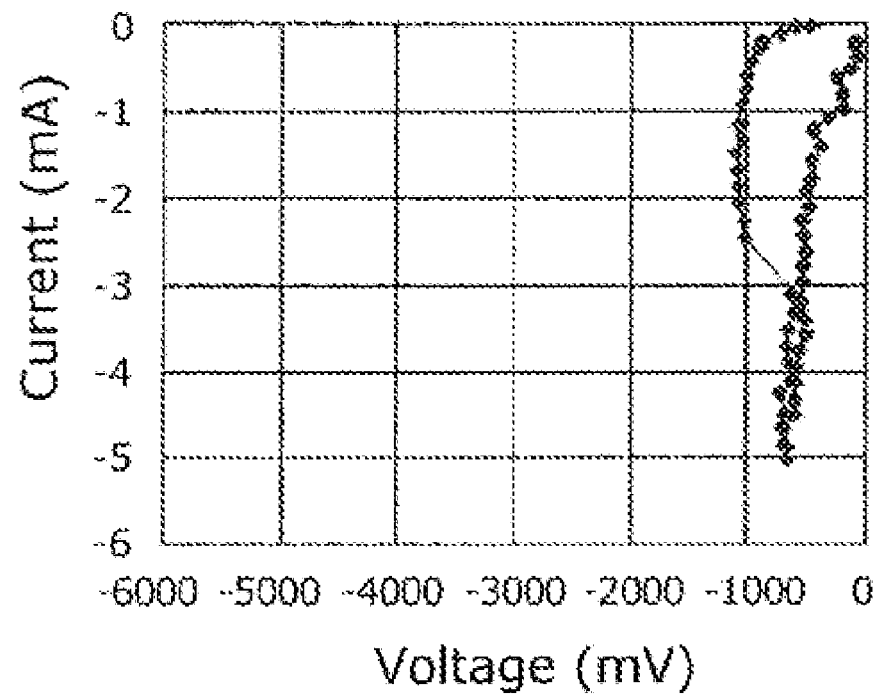
(b) 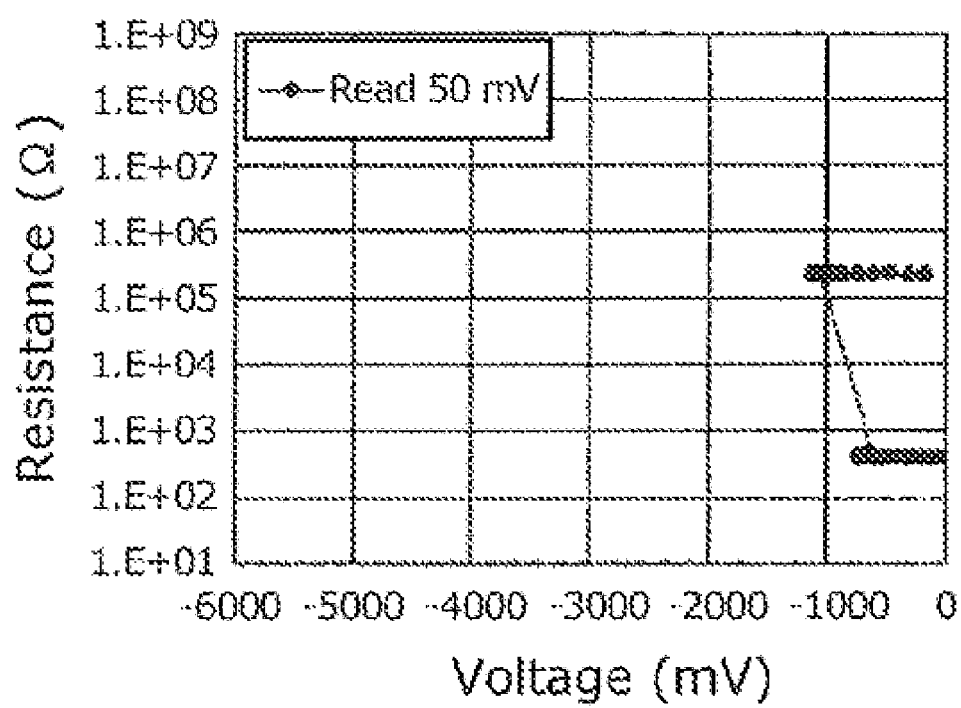

FIG. 23
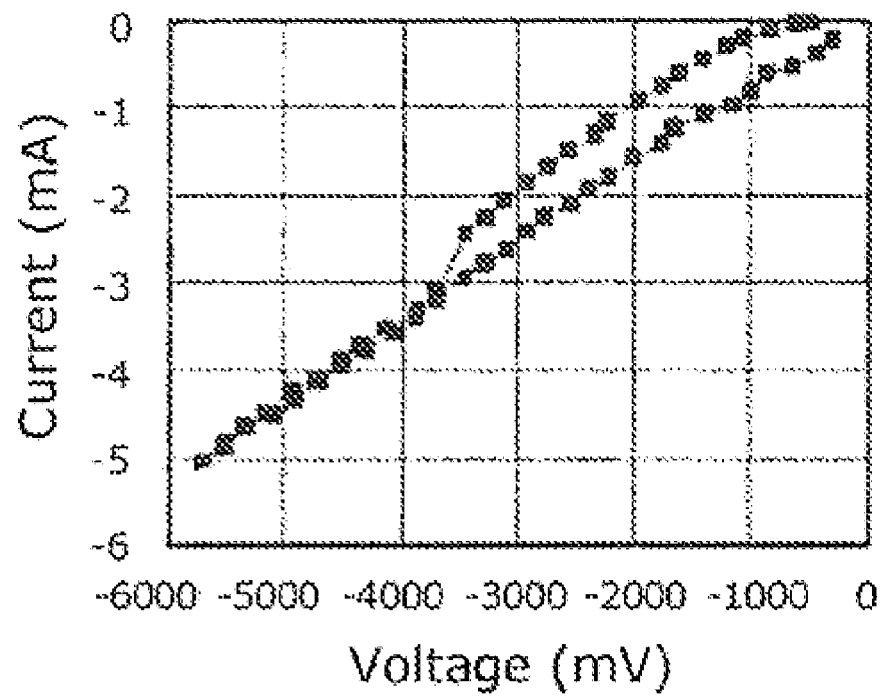
(a)
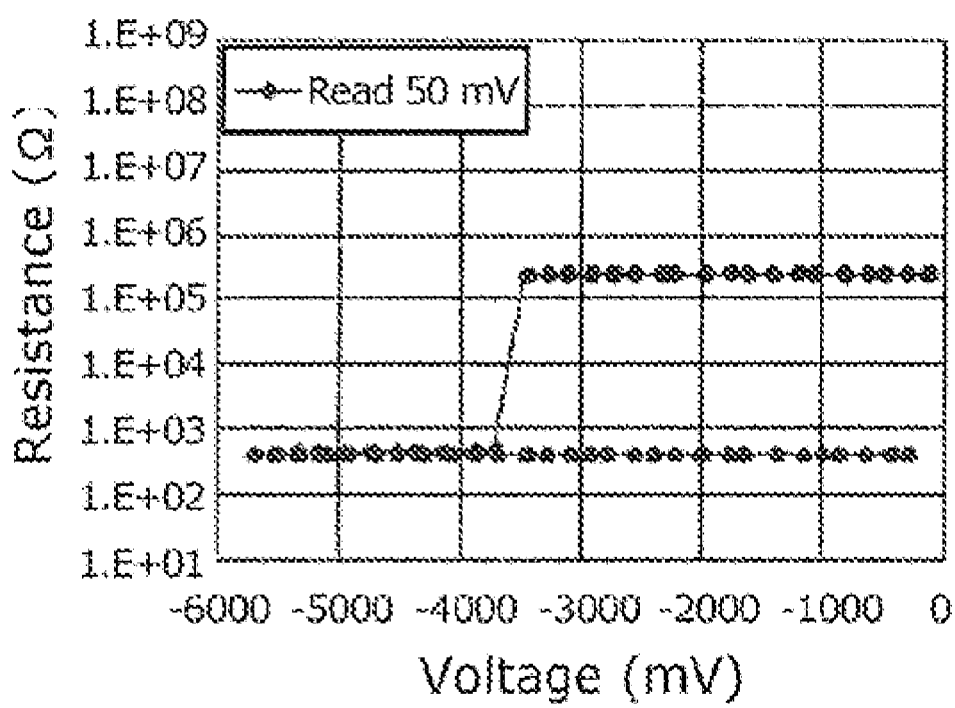
(b)

NONVOLATILE MEMORY ELEMENT AND NONVOLATILE MEMORY DEVICE

TECHNICAL FIELD

The present invention relates to a nonvolatile memory element, and in particular to a so-called variable resistance nonvolatile memory element whose resistance state reversibly changes between a high resistance state and a low resistance state based on a polarity of an applied voltage, and a nonvolatile memory device including the nonvolatile memory element.

BACKGROUND ART

With the development of digital technology, electronic devices such as mobile information devices and home information appliances have become increasingly highly functional in recent years. Thus, we have seen a rise in the demand for nonvolatile memory elements which have larger capacity, allow power reduction in writing, reduce writing and reading time, and have longer operating life.

It is said that miniaturization of flash memories using existing floating gates has a limit to meet such a demand. On the other hand, in the case of a variable resistance nonvolatile memory element in which a variable resistance layer is used as a material of a memory unit, it is possible to form the variable resistance nonvolatile memory element with a memory element having a simple structure in which the variable resistance layer is placed between an upper electrode and a lower electrode, and thus there are expectations for further miniaturization, reduction in writing and reading time, and low power consumption.

For instance, a nonvolatile memory element has been proposed which creates a high resistance state and a low resistance state by implanting and extracting metal ions through application of voltage between an upper electrode and a lower electrode and which stores data by assigning a numerical value to each of the states (refer to Patent Literature 1, for example). Furthermore, a nonvolatile memory element has been proposed which is called a phase-change memory and in which a resistance state of a resistant variable layer is changed by changing a crystalline state of the variable resistance layer with electrical pulses (refer to Patent Literature 2, for instance).

Moreover, in addition to the above, a variable resistance nonvolatile memory element has been proposed in which a variable resistance layer is made of a metal oxide. Such a nonvolatile memory element is largely divided into two types depending on a material used for the variable resistance layer. One of the types is a variable resistance nonvolatile memory element which is disclosed in Patent Literature 3 and the like and in which a variable resistance layer is made of a perovskite material ($Pr_{1-x}Ca_xMnO_3$ (PCMO), $La_{1-x}Sr_xMnO_3$ (LSMO), $GdBaCo_xO_y$ (GBCO), or the like).

Furthermore, the other type is a variable resistance nonvolatile memory element in which a variable resistance layer is made of a binary transition metal oxide. The binary transition metal oxide has very simple composition and structure in comparison with the above perovskite material, and thus it is easy to perform composition control and film formation at the time of manufacture. On top of that, the binary transition metal oxide has an advantage that compatibility with a semiconductor fabrication process is relatively favorable, and many researches on the binary transistor metal oxide have been conducted in recent years. For example, Patent Literature 4 and Non Patent Literature 1 disclose NiO, $V_2O_5$, ZnO, $Nb_2O_5$, $TiO_2$, $WO_3$, CoO as variable resistance materials. Moreover, Patent Literature 5 discloses a variable resistance nonvolatile memory element in which a suboxide (oxide deviating from stoichiometric composition) such as Ni, Ti, Hf, Nb, Zn, W, and Co is used as a variable resistance material. In addition, an example has been proposed where a structure in which the surface of TiN is oxidized and a $TiO_2$ crystalline film in nanometer order is formed is used for a variable resistance layer (refer to Patent Literature 6 and Non Patent Literature 2, for instance).

Furthermore, a so-called one-time programmable memory has been proposed in which a titanium oxide and a tantalum oxide ($Ta_2O_5$) are used as variable resistance materials and which allows one-time writing (refer to Patent Literature 7, for example).

CITATION LIST

Patent Literature

[PTL 1]
Japanese Unexamined Patent Application Publication No. 2006-40946.
[PTL 2]
Japanese Unexamined Patent Application Publication No. 2004-349689.
[PTL 3]
U.S. Pat. No. 6,473,332 Specification
[PTL 4]
Japanese Unexamined Patent Application Publication No. 2004-363604.
[PTL 5]
Japanese Unexamined Patent Application Publication No. 2005-317976.
[PTL 6]
Japanese Unexamined Patent Application Publication No. 2007-180202.
[PTL 7]
Japanese Unexamined Patent Application Publication No. 7-263647.

Non Patent Literature

[NPL 1]
I. G. Beak Et Al., Tech. Digest IEDM 2004, p. 587
[NPL 2]
Japanese Journal of Applied Physics Vol 45, NO1 1, 2006, pp. L310-L312

SUMMARY OF INVENTION

Technical Problem

However, the conventional nonvolatile memory elements in which the variable resistance layers are made of the above-described transition metal oxides have the following problems.

As disclosed in Non Patent Literature 1, in the conventional nonvolatile memory element in which the transition metal oxide such as NiO is used, it is possible to change the resistance state of the variable resistance material from a high resistance state to a low resistance state, using relatively short electrical pulses of approximately 100 ns. However, long pulses in μs order are required to change the resistance state from the low resistance state to the high resistance state, and thus there is a problem that it is difficult to achieve reduction in writing and reading time.

Moreover, there is a problem that the change of the resistance state does not occur right after a structure in which the variable resistance material is placed between upper and lower electrodes is formed. In this case, it is considered that a "running-in" process (sometimes referred to as a forming process) in which a special electrical impulse is applied between the upper and lower electrodes from a few dozen times to several thousand times is required to cause the change of the resistance state. However, such a forming process can be regarded as one of manufacturing processes, which can cause an increase in cost and complication of the manufacturing processes.

It is to be noted that in this DESCRIPTION a process of changing a resistance state of a variable resistance nonvolatile memory element immediately after its manufacture by applying, from one to approximately ten times, an electrical pulse which differs from an electrical pulse which enables steady change of the resistance state in polarity (positive or negative), amplitude (voltage value), and width (time) is defined as "initial breakdown". For example, in the case where, to operate a nonvolatile memory element whose resistance state changes with an electrical pulse having the amplitude of 2 V and the width of 100 ns, there is a need for application of electrical pulses which differ from the electrical pulses immediately after manufacture of the nonvolatile memory element (e.g., application of electrical pulses having the amplitude of ±3 V and the width of 1 μs ten times), it is expressed that the initial breakdown is required.

Initial breakdown mechanism for a nonvolatile memory element which is in a high resistance state in an initial state is considered the same as dielectric breakdown mechanism of dielectric films. This is, for example, described in K. Kinoshita et al., Applied Physics Letters vol. 89, 103509 (Non Patent Literature 3).

On the other hand, the initial breakdown is not required for the variable resistance nonvolatile memory element which is disclosed in Patent Literature 6 and Non Patent Literature 2 and has the structure (TiO$_2$/TiN structure) in which the surface of TiN is oxidized and microcrystalline TiO$_2$ is formed. In this case, it is considered that TiO$_2$ forms an aggregate of minute crystals in nanometer order (hereinafter, referred to as nanocrystals) and a state of resistance change varies according to a size of the crystals, but generally the size and crystal structure of the nanocrystals largely depend on a forming method (formed by oxidation in Patent Literature 6), and accordingly there is a possibility of increasing variations in the state of the resistance change in manufacturing. Thus, there is a problem that forming the variable resistance layer with the nanocrystals causes the variations in the state of the resistance change.

Furthermore, there is a problem that a nonvolatile memory element cannot be rewritten because the nonvolatile memory element serves as an anti-fuse available for only one operation which causes a change from a high resistance state to a low resistance state when a variable resistance layer thereof is mainly made of a transition metal oxide including Ta$_2$O$_5$ disclosed in Patent Reference 7.

The present invention has been conceived in view of the above situations, and has a main object to provide a nonvolatile memory element which operates at a low breakdown voltage and stably at high speed, and a nonvolatile memory device including the nonvolatile memory element.

Solution to Problem

In order to solve the above problems, a nonvolatile memory element according to a first aspect of the present invention is a variable resistance nonvolatile memory element which includes: a first electrode; a second electrode; and a variable resistance layer which is placed between the first electrode and the second electrode, and whose resistance state reversibly changes between a high resistance state and a low resistance state based on a polarity of a voltage applied between the first electrode and the second electrode, wherein the nonvolatile memory element has a characteristic of changing into a state where the resistance state can change after an initial breakdown is performed when the nonvolatile memory element is in an initial state, the initial breakdown being for applying, to the nonvolatile memory element, a breakdown voltage with a load element connected to the nonvolatile memory element, and the initial state being a state where the nonvolatile memory element has a resistance value higher than a resistance value of the nonvolatile memory element of which the variable resistance layer is in the high resistance state, the variable resistance layer has a stacked structure of at least a first oxide layer and a second oxide layer, the first oxide layer including an oxide of a first transition metal, and the second oxide layer including an oxide of a second transition metal which is different from the first transition metal, and a standard electrode potential of the second transition metal is lower than a standard electrode potential of the first transition metal, and at least one of the following conditions is satisfied: (1) a dielectric constant of the second oxide layer is larger than a dielectric constant of the first oxide layer; and (2) a band gap of the second oxide layer is smaller than a band gap of the first oxide layer.

With this, because the at least one of the following conditions is satisfied: (1) the dielectric constant of the second oxide layer is larger than that of the first oxide layer; and (2) the band gap of the second oxide layer is smaller than that of the first oxide layer, a strength of a breakdown electric field of the second oxide layer having a high resistivity is reduced more than that of the first oxide layer having a low resistivity. As a result, a breakdown voltage in the initial breakdown of the nonvolatile memory element (i.e., a nonvolatile memory element including a variable resistance layer having a stacked structure of transition metal oxide layers) which is in the high resistance state in the initial state is reduced, the second oxide layer including the second transition metal having a small standard electrode potential, that is, the second oxide layer being easy to oxidize among the first oxide layer and the second oxide layer included in the variable resistance layer.

Here, in the nonvolatile memory element according to the first aspect, both of the following conditions may be satisfied: (1) the dielectric constant of the second oxide layer is larger than the dielectric constant of the first oxide layer; and (2) the band gap of the second oxide layer is smaller than the band gap of the first oxide layer.

It is to be noted that in the nonvolatile memory element according to the first aspect, the second electrode is preferably formed in contact with the second oxide layer, and a standard electrode potential of a material of the second electrode is preferably higher than the standard electrode potential of the second transition metal. With this, because a condition for causing a resistance change of an oxygen-deficient transition metal oxide layer (that is, the second oxide layer) is satisfied in the relationship between the oxygen-deficient transition metal oxide layer and its adjacent electrode, the resistance change of the nonvolatile memory element is assured, and a stable operation is achieved.

Furthermore, in the nonvolatile memory element according to the first aspect, the standard electrode potential of the first transition metal is preferably lower than the standard electrode potential of the second electrode.

Moreover, in the nonvolatile memory element according to the first aspect, a degree of oxygen deficiency of the first oxide layer is preferably greater than a degree of oxygen deficiency of the second oxide layer.

Furthermore, in the nonvolatile memory element according to the first aspect, a thickness of the second oxide layer is preferably less than a thickness of the first oxide layer.

Moreover, in the nonvolatile memory element according to the first aspect, a resistivity of the second oxide layer is preferably greater than a resistivity of the first oxide layer.

Furthermore, in the nonvolatile memory element according to the first aspect, a load element may be electrically connected to the nonvolatile memory element, and the load element may be a fixed resistor, a transistor, or a diode.

Moreover, in the nonvolatile memory element according to the first aspect, the first transition metal is preferably made of Ta, and further the second transition metal is preferably made of Ti, Sr, or Nb. With this, a nonvolatile memory element having a low breakdown voltage is realized which satisfies both of the following conditions: (1) the dielectric constant of the second oxide layer is larger than the dielectric constant of the first oxide layer; and (2) the band gap of the second oxide layer is smaller than the band gap of the first oxide layer.

Furthermore, a nonvolatile memory device according to a second aspect of the present invention includes: a semiconductor substrate; first wires formed parallel to each other on the semiconductor substrate; second wires formed above the first wires so as to be parallel to each other on a plane parallel to a principal plane of the semiconductor substrate and to three-dimensionally cross the first wires; a memory cell array which includes nonvolatile memory elements including the nonvolatile memory element according to the first aspect, the nonvolatile memory elements each being provided to correspond to one of crosspoints between the first wires and the second wires; a selection circuit which selects at least one of the nonvolatile memory elements included in the memory cell array; a write circuit which writes data by applying a voltage to the selected nonvolatile memory element; and a readout circuit which reads the data by detecting a resistance value of the selected nonvolatile memory element.

With this, because the nonvolatile memory device according to the second aspect includes the nonvolatile memory elements according to the present invention which have the above-described characteristics, the breakdown voltage of the initial breakdown of each nonvolatile memory element which is in the high resistance state in the initial state is reduced.

Here, the nonvolatile memory device according to the second aspect may include a current controlling element electrically connected to each of the nonvolatile memory elements.

Moreover, a nonvolatile memory device according to a third aspect of the present invention includes: a semiconductor substrate; word lines and bit lines which are formed above the semiconductor substrate; transistors each of which is connected to corresponding ones of the word lines and the bit lines; a memory cell array which includes nonvolatile memory elements including the nonvolatile memory element according to the first aspect, the nonvolatile memory elements being provided to correspond to the transistors on a one-on-one basis; a selection circuit which selects at least one of the nonvolatile memory elements included in the memory cell array; a write circuit which writes data by applying a voltage to the selected nonvolatile memory element; and a readout circuit which reads the data by detecting a resistance value of the selected nonvolatile memory element.

With this, because the nonvolatile memory device according to the third aspect includes the nonvolatile memory elements according to the present invention which have the above-described characteristics, the breakdown voltage of the initial breakdown of each nonvolatile memory element which is in the high resistance state in the initial state is reduced.

SUMMARY OF INVENTION

The nonvolatile memory element and the nonvolatile memory device according to the present invention allow the reduction in the breakdown voltage of the initial breakdown of the nonvolatile memory element and the reliable change of the resistance value of the nonvolatile memory element, and thus achieve the stable operation.

BRIEF DESCRIPTION OF DRAWINGS

FIG. 2 is a cross-sectional view showing manufacturing processes of the nonvolatile memory element according to Embodiment 1 of the present invention.

FIG. 22 is a graph showing electric characteristics of an experimental single nonvolatile memory element in the case where a second tantalum oxide layer has the thickness of 3 nm.

FIG. 23 is a graph showing electric characteristics of the experimental nonvolatile memory element when a load element is connected thereto and in the case where the second tantalum oxide layer has the thickness of 3 nm.

DESCRIPTION OF EMBODIMENTS

Hereinafter, preferred embodiments of the present invention shall be described with reference to the Drawings.

Embodiment 1

First, the following describes a nonvolatile memory element according to Embodiment 1 of the present invention.

(Structure of Nonvolatile Memory Element)

Figure 1:
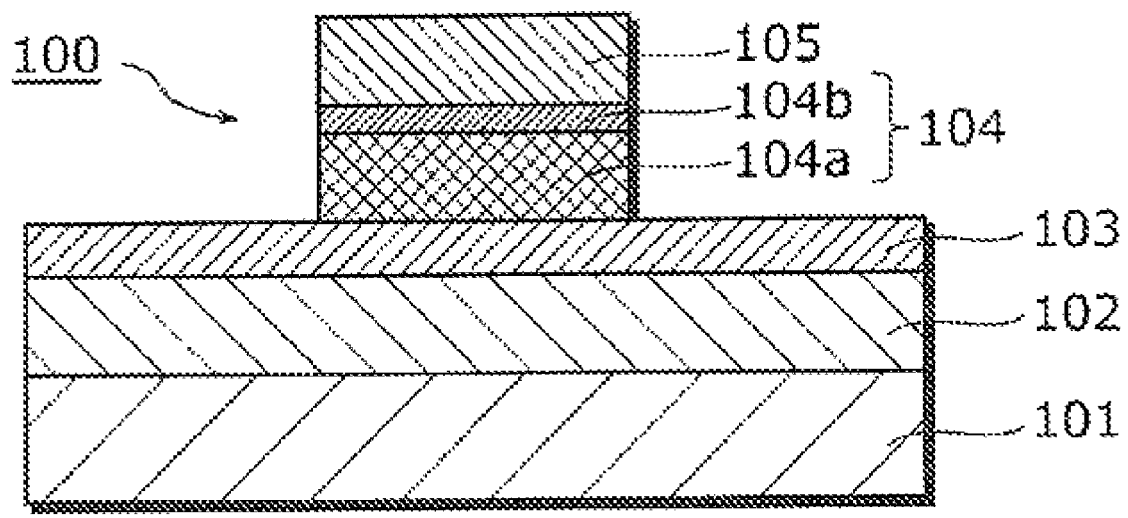
FIG. 1 is a cross-sectional view showing a structure of a nonvolatile memory element according to Embodiment 1 of the present invention.

FIG. 1 is a cross-sectional view showing a structure of a nonvolatile memory element 100 according to Embodiment 1 of the present invention. As shown in FIG. 1, the nonvolatile memory element 100 is a variable resistance nonvolatile memory element, and includes a substrate 101, an oxide layer 102 formed on the substrate 101, a first electrode layer 103 formed on the oxide layer 102, a second electrode layer 105, and a variable resistance layer 104 formed between the first electrode layer 103 and the second electrode layer 105. The first electrode layer 103 and the second electrode layer 105 are electrically connected to the variable resistance layer 104.

The variable resistance layer 104 is a bipolar variable resistance layer whose resistance state reversibly changes between a high resistance state and a low resistance state based on a polarity of a voltage applied between the first electrode layer 103 and the second electrode layer 105, and includes a first oxide layer 104a made of a tantalum oxide and a second oxide layer 104b made of a titanium oxide and formed on the first oxide layer 104a, the tantalum oxide having composition represented by $TaO_x$, and the titanium oxide having composition represented by $TiO_2$.

These first oxide layer 104a ($TaO_x$ in the present embodiment) and second oxide layer 104b ($TiO_2$ in the present embodiment) satisfy the relationships below. More specifically, a standard electrode potential of a transition metal (second transition metal) included in the second oxide layer 104b is lower than that of a transition metal (first transition metal) included in the first oxide layer 104a. Furthermore, at least one of the following conditions is satisfied: (1) a dielectric constant of the second oxide layer 104b is higher than that of the first oxide layer 104a; and (2) a band gap of the second oxide layer 104b is smaller than that of the first oxide layer 104a. It is to be noted that both of the conditions (1) and (2) are satisfied in the present embodiment. The significance of the above will be described later.

It is to be noted that the nonvolatile memory element 100 has a characteristic of changing into a state where a resistance state of the nonvolatile memory element 100 can change between a high resistance state and a low resistance state after an initial breakdown is performed when the nonvolatile memory element 100 is in an initial state. Here, the initial breakdown is for applying, to the nonvolatile memory element 100, a breakdown voltage with a load element connected to the nonvolatile memory element 100, and the initial state is a state where the nonvolatile memory element 100 has a resistance value higher than a resistance value of the same of which the variable resistance layer 104 is in the high resistance state.

In the case of programming the nonvolatile memory element 100, an external power source applies, between the first electrode layer 103 and the second electrode layer 105, a pulse voltage satisfying a predetermined condition. Here, a relative potential (voltage) of the second electrode layer 105 with respect to the first electrode layer 103 is defined as a voltage to be applied between the first electrode layer 103 and the second electrode layer 105. Thus, an applied voltage is a positive applied voltage which causes the electric potential of the second electrode layer 105 to be higher than that of the first electrode layer 103, whereas an applied voltage is a negative applied voltage which causes the electric potential of the second electrode layer 105 to be lower than that of the first electrode layer 103.

The substrate 101 may be, for example, a silicon single crystal substrate or a semiconductor substrate. However, the present invention is not limited to the above. The variable resistance layer 104 can be formed at a relatively low substrate temperature, which allows the variable resistance layer 104 to be formed on a resin material or the like.

Moreover, the first electrode layer 103 and the second electrode layer 105 correspond to a first electrode and a second electrode according to the present invention, and are formed of one or more materials selected from among Au (gold), Pt (platinum), Ir (iridium), Pd (palladium), Ag (silver), Ni (nickel), W (tungsten), Cu (copper), TaN (tantalum nitride), and so on. It is to be noted that preferred material of the second electrode layer 105 will be described later.

(Method of Manufacturing Nonvolatile Memory Element)

The nonvolatile memory element thus formed can be manufactured in the following manner.

FIG. 2 (a) to (c) are cross-sectional views showing manufacturing processes of a nonvolatile memory element according to Embodiment 1 of the present invention.

First, as shown in FIG. 2 (a), by thermal oxidation, the oxide layer 102 having the thickness of 200 nm is formed on the substrate 101 made of single-crystal silicon. Then, by sputtering, a TaN thin film having the thickness of 100 nm is formed on the oxide layer 102 as the first electrode layer 103. Subsequently, the first oxide layer 104a is formed on the first electrode layer 103 by reactive sputtering using a Ta target.

Here, the first oxide layer 104a is deposited under the condition described below. Specifically, after the substrate is placed inside a sputtering apparatus, the inside of the sputtering apparatus is vacuumed to approximately $8 \times 10^{-6}$ Pa. Then, the sputtering is performed for 20 seconds with tantalum used as the target, power set to 1.6 kW, a flow of argon gas at 34 sccm, a flow of oxygen gas at 21 sccm, and pressure in the sputtering apparatus being kept at 0.17 Pa. With this, the first oxide layer having a resistivity of 6 mΩcm and an oxygen content percentage of about 61 at % ($TaO_{1.6}$) can be deposited for 30 nm. It is to be noted that although $TaO_{1.6}$ is an example of a first oxide layer according to the present invention, the first oxide layer according to the present invention is not limited to such a material, and may be any oxide layer as long as the oxide layer satisfies, as mentioned above, at least one of the following conditions: (1) the dielectric constant of the second oxide layer 104b is higher than that of the first oxide layer 104a; and (2) the band gap of the second oxide layer 104b is smaller than that of the first oxide layer 104a. For instance, the oxide layer may be $TaO_x$ ($0.8 \leq x \leq 1.9$).

Next, as shown in FIG. 2 (b), by sputtering, the second oxide layer 104b is formed on the first oxide layer 104a with $TiO_2$ used as a target. In the present embodiment, the second oxide layer 104b is formed by depositing an oxide layer having the thickness of 3 nm.

Subsequently, by sputtering, an Ir thin film having the thickness of 150 nm is formed on the second oxide layer 104b as the second electrode layer 105. Lastly, a pattern 106 which is made of a photoresist is formed by a photolithography process, and an element region 107 is formed by dry etching (see FIG. 2 (c)). Here, the element region 107 is square-shaped with each side being 0.5 μm in length.

(Example Operations of Nonvolatile Memory Element)

Hereinafter, example operations of the nonvolatile memory element thus formed according to the present embodiment, that is, example operations in the case of writing and reading data shall be described.

Figure 3:
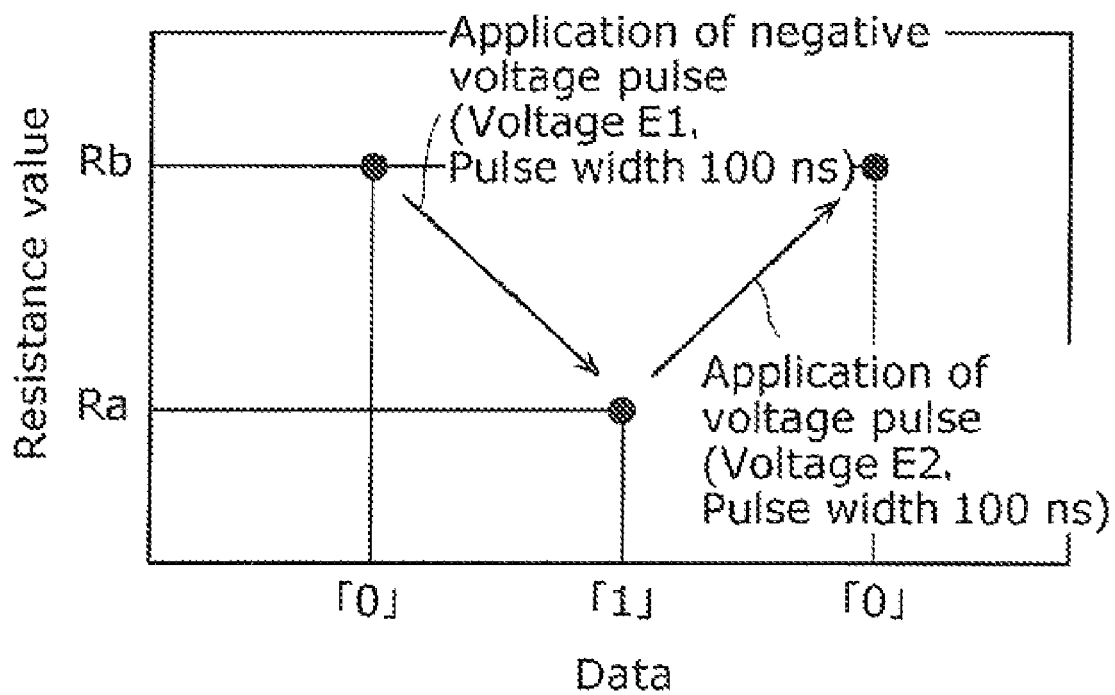
FIG. 3 is a diagram showing example operations, in the case of writing data, of the nonvolatile memory element according to Embodiment 1 of the present Invention.

FIG. 3 is a diagram showing example operations, in the case of writing data, of the nonvolatile memory element according to the present embodiment.

Alternately applying, between the first electrode layer 103 and the second electrode layer 105, two types of electrical pulses each having, for example, the pulse width of 100 ns and a different polarity changes a resistance value of the variable resistance layer 104 as shown in FIG. 3. More specifically, when a negative voltage pulse (voltage of E1 volt, pulse width 100 ns) is applied between the electrode layers, the resistance value of the variable resistance layer 104 is reduced from a high resistance value Rb to a low resistance value Ra. In other words, a resistance state of the variable resistance layer 104 changes from a high resistance state to a low resistance state. On the other hand, when a positive voltage pulse (voltage of E2 volt, pulse width 100 ns) is applied between the electrode layers, the resistance value of the variable resistance layer 104 is increased from the low resistance value Ra to the high resistance value Rb. In other words, the resistance state of the variable resistance layer 104 changes from the low resistance state to the high resistance state.

In the example shown in FIG. 3, the high resistance value Rb and the low resistance value Ra are assigned to data "0" and data "1", respectively. Thus, in the present embodiment, the data "0" is written by applying the positive voltage pulse between the electrode layers so that the resistance value of the variable resistance layer 104 changes into the high resistance value Rb, and the data "1" is written by applying the negative voltage pulse between the electrode layers so that the resistance value of the variable resistance layer 104 changes into the low resistance value Ra.

Figure 4:
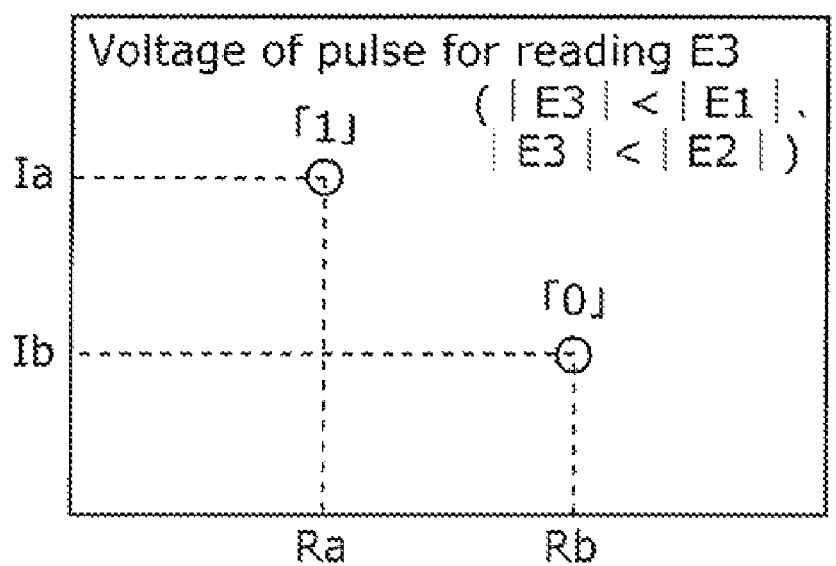
FIG. 4 is a diagram showing example operations, in the case of reading data, of the nonvolatile memory element according to Embodiment 1 of the present invention.

FIG. 4 is a diagram showing example operations, in the case of reading data, of the nonvolatile memory element 100 according to the present embodiment.

In the case of reading the data, a reading voltage of E3 volt (|E3|<|E1|, |E3|<|E2|) which has an amplitude smaller than that of a voltage pulse which is applied to change the resistance value of the variable resistance layer 104 is applied between electrodes. As a result, a current is provided according to the resistance value of the variable resistance layer 104, and detecting a value of the current enables reading of written data ("0" or "1").

In the example shown in FIG. 4, an output current value Ia and an output current value Ib correspond to the low resistance value Ra and the high resistance value Rb, respectively, and thus the data "1" is read when the output current value Ia is detected and the data "0" is read when the output current value Ib is detected.

(Material of First Oxide Layer and Second Oxide Layer)

As stated above, in the present embodiment, the variable resistance layer 104 has a stacked structure including the first oxide layer 104a and the second oxide layer 104b, and the first oxide layer 104a and the second oxide layer 104b are made of TaO$_x$ and TiO$_2$, respectively. However, materials of the first oxide layer 104a and the second oxide layer 104b are not limited to the above materials. The following describes what kind of material is suitable for the first oxide layer 104a and the second oxide layer 104b.

First, it is preferable that the second oxide layer 104b has a higher resistivity than the first oxide layer 104a. This is because the following inference holds true for a resistance change mechanism of variable resistance layers in nonvolatile memory elements.

Although the resistance change of the variable resistance layers in the nonvolatile memory elements has not yet been understood clearly so far, it is inferred that movement of oxygen atoms in an interface between an electrode and a variable resistance layer causes resistance change. In view of the above, it is considered that the second oxide layer 104b according to the present embodiment effectively applies a voltage to the vicinity of the interface. To go into details, it is considered that concentration or diffusion of the oxygen atoms in the vicinity of the interface between the second electrode layer and the variable resistance layer causes occurrence of a resistance change phenomenon. More specifically, applying a positive voltage to the second electrode layer (with reference to the first electrode layer) concentrates negatively charged oxygen atoms at the side of the second electrode layer, and a high resistance layer is formed accordingly. Thus, the resistance state of the variable resistance layer changes into the high resistance state. Conversely, applying a negative voltage to the second electrode layer (with reference to the first electrode layer) diffuses the oxygen atoms in the variable resistance layer, and the resistance value is reduced. Here, if the high resistance layer is in the interface (to be precise, the interface on the side of the variable resistance layer), a large voltage is applied to the high resistance layer. Thus, oxygen is implanted into the high resistance layer. As a result, the high resistance layer becomes almost like an insulator. For this reason, resistance of the variable resistance layer itself is increased, and the variable resistance layer is in the high resistance state. However, if such a high resistance layer is not in the interface, a voltage is equally applied to the variable resistance layer, and a layer similar to the insulator is not easily formed in the vicinity of the interface. Consequently, the resistance change phenomenon does not occur easily.

In view of the above, it is preferable that the high resistance layer is in the interface between the electrode and the variable resistance layer. Thus, it is preferable to provide the second oxide layer 104b to the interface between the second electrode layer 105 and the variable resistance layer 104 in the nonvolatile memory element 100 according to the present embodiment, the second oxide layer 104b having the higher resistivity than the first oxide layer 104a.

Furthermore, according to the above inference, it is preferable that the second transition metal included in the second oxide layer 104b is oxidized more easily than the first transition metal included in the first oxide layer 104a. When the second oxide layer 104b is made of the second transition metal which is oxidized more easily than the first transition metal, applying the positive voltage between the first electrode layer 103 and the second electrode layer 105 facilitates the change of the resistance state of the second oxide layer 104b into the high resistance state, and thus it is easy to change the resistance state of the variable resistance layer 104 into the high resistance state.

It is possible to determine whether or not a material is oxidized easily, based on a standard electrode potential of the material. To put it differently, the larger a value of the standard electrode potential is, the material is not oxidized easily, and, to the contrary, the smaller the value of the standard electrode potential is, the material is oxidized easily. Consequently, in the present embodiment, it is preferable that a standard electrode potential of the second transition metal included in the second oxide layer 104b is lower than that of the first transition metal included in the first oxide layer 104a (that is, the second transition metal is oxidized easily). Moreover, for the same reason, it is preferable that a degree of oxygen deficiency of the second oxide layer 104b is smaller than that of the first oxide layer 104a. It is to be noted that the degree of oxygen deficiency is a degree (rate) of oxygen deficiency to the stoichiometric composition.

It is to be noted that, as stated above, when the standard electrode potential of the second transition metal included in the second oxide layer 104b is lower than that of the first transition metal included in the first oxide layer 104a, the second oxide layer 104b naturally has a higher degree of oxidation than the first oxide layer 104a. For this reason, there is an advantage that destruction of an oxygen concentration profile in a variable resistance film can be suppressed even when a thermal budget expands during, for instance, a semiconductor manufacturing process. This produces an effect which enables application of the nonvolatile memory device according to the present embodiment to a crosspoint nonvolatile memory device having a multi-stacked structure for higher-capacity.

In the meantime, as shown in FIG. 1 of J. McPherson et al., IEDM 2002, p. 633-636 (Non Patent Literature 4), between a dielectric constant and a strength (breakdown strength) of a breakdown electric field of an oxide layer, there is a correlation that the larger the dielectric constant is, the less the breakdown strength of the dielectric breakdown electric field is. From this, in order to reduce a breakdown voltage of the nonvolatile memory element, it is preferable that the dielectric constant of the second oxide layer 104b is larger than that of the first oxide layer 104a so that the strength of the breakdown electric field is reduced. With this, it is possible to achieve a nonvolatile memory element capable of performing a stable resistance change operation at a lower breakdown voltage.

It is to be noted that the reason why reducing the strength of the breakdown electric filed of the second oxide layer 104b reduces the breakdown voltage is as follows. Stated differently, the initial state of the nonvolatile memory element is a high resistance state which has an extremely high resistance value determined by the second oxide layer 104b having the high resistivity, the nonvolatile memory element including the variable resistance layer having the stacked structure of the transition metal oxide layers. Thus, in order to perform the initial breakdown which breaks down the initial state, it is necessary to perform breakdown on the second oxide layer 104b. Therefore, reducing the strength of the breakdown electric field of the second oxide layer 104b reduces a voltage required for the initial breakdown, that is, the breakdown voltage.

Furthermore, as also shown in FIG. 2 of Non Patent Literature 4, between a band gap and a breakdown electric field of an oxide layer, there is a correlation that the larger the band gap is, the greater the strength of the breakdown electric field is. From this, in order to reduce the breakdown voltage of the nonvolatile memory element, it is preferable that a band gap of the second oxide layer 104b is smaller than that of the first oxide layer 104a so that the strength of the breakdown electric field is reduced.

As stated above, in order to reduce the breakdown voltage, in the nonvolatile memory element 100 according to the present embodiment, respective materials of the first oxide layer 104a and the second oxide layer 104b are selected so that at least one of the following conditions is satisfied: (1) the dielectric constant of the second oxide layer 104b is higher than the dielectric constant of the first oxide layer 104a; and (2) the band gap of the second oxide layer 104b is smaller than the band gap of the first oxide layer 104a.

Table 1 below sums up data about physical properties of various types of transition metals.

through thickness of the first oxide layer 104a and the second oxide layer 104b. Examination of the thickness reveals that when the thickness of the second oxide layer 104b, the high resistance layer, is too much, an initial resistance value of the variable resistance layer 104 is high, and thus inconvenience such as difficulty of starting the resistance change and requirement of the initial breakdown occurs. On the other hand, when the thickness is too small, a problem that the stable resistance change operation cannot be obtained may

TABLE 1

| | Standard Electrode Potential (eV) | Oxide | Dielectric Constant | Band Gap (eV) | Breakdown Electric Field (MV/cm) | Conduction Band Offset (eV) vs. Si |
|---|---|---|---|---|---|---|
| Sr | −2.89 | $SrTiO_3$ | 120-183 | 3.3 | 1.0-1.1 | 1.75 |
| Al | −1.68 | $Al_2O_3$ | 8.5 | 8.8 | 7.2 | 2.8 |
| Ti | −1.63 | $TiO_2$ | 95 | 3.1 | 1.0-3.0 | 1.7 |
| Hf | −1.55 | $HfO_2$ | 21 | 6.0 | 3.0-4.7 | 2.5-4.0 |
| Zr | −1.45 | $ZrO_2$ | 29 | 5.8 | 3.8 | 2.5 |
| Nb | −1.1 | $Nb_2O_5$ | 35 | 3.4 | | 1.4 |
| Ta | −0.6 | $Ta_2O_5$ | 26 | 4.4 | 3.2 | 0.36 |
| W | 0.1 | $WO_3$ | 20.2 | 2.2 | | — |
| Co | −0.28 | CoO | 12.9 | 0.6 | | — |
| Ni | −0257 | NiO | 11.9 | 1.72 | | — |
| Fe | $−0.037Fe^{3+}$ | $Fe_2O_3$ | — | 2.1 | | — |
| Cu | 0.3419 0.521 | $Cu_2O$ | 10.3 | 1.83 | | — |

The data about a standard electrode potential of each transition metal in Table 1 is described in "Lange's Handbook Of Chemistry" and "CRC Handbook of Chemistry And Physics". Table 2 below shows references on physical properties of oxides of Sr (strontium), Al (aluminum), Ti (titanium), Hf (hafnium), Zr (zirconium), Nb (niobium), and Ta (tantalum).

TABLE 2

| | |
|---|---|
| $SrTiO_3$ | K. Abe and S. Komatsu. Jpn. J. Appl. Phys. Vol. 32(1993). |
| $Al_2O_3$ | D. Park. et. al.. J. Appl. Physics. Vol. 89. 6275(2001). |
| $TiO_2$ | Lee. Y. Jeon. et. al.. Appl. Phys. Lett.. Vol. 74. 3143(1999). |
| $HfO_2$ | T. Ma. Solid-State IC Technology Conference Proceedings. 297(2001). |
| $ZrO_2$ | L. Manchanda. et. al.. IEDM Technical Digest. 23(2000). |
| $Nb_2O_5$ | H. H. Kung. et. al.. J. Appl. Phys.. Vol. 48. 2463(1977). |
| $Ta_2O_5$ | Y. Wu. et. al.. IEEE Elect. Device Letters. Vol. 21. 341(2000). |

Based on the above consideration of the standard electrode potential, the dielectric constant, and the band gap, it is preferable that the first oxide layer 104a is made of an oxide such as $TaO_x$, $NiO_x$, $WO_x$, $CoO_x$, or $FeO_x$ and that the second oxide layer 104b is made of an oxide such as $TiO_2$, $SrTiO_3$, or $Nb_2O_5$.

In particular, when the first oxide layer 104a is made of $TaO_x$ ($0.8 \leq x \leq 1.9$), it is preferable that the second oxide layer 104b is made of $TiO_2$, $SrTiO_3$, or $Nb_2O_5$. As is clear from Table 1 above, this is because, with these combinations, the standard electrode potential of the second transition metal included in the second oxide layer 104b is lower than that of the first transition metal included in the first oxide layer 104a, and both of the conditions is satisfied which are (1) the dielectric constant of the second oxide layer 104b is higher than that of the first oxide layer 104a and (2) the band gap of the second oxide layer 104b is smaller than that of the first oxide layer 104a. It is to be noted that a physical property of the $TaO_x$ ($0.8 \leq x \leq 1.9$) is expected to be substantively the same as or slightly less than that of $Ta_2O_5$.

(Thickness of First Oxide Layer and Second Oxide Layer)

In the present embodiment, it is possible to control the resistance value of the whole variable resistance layer 104 occur. In view of the above, it is preferable that at least the thickness of the second oxide layer 104b is smaller than that of the first oxide layer 104a.

(Material of Electrode)

Hereinafter, preferred materials used for the second electrode layer 105 in the nonvolatile memory element 100 according to the present embodiment shall be considered.

The inventors have performed the following experiment using two types of oxygen-deficient transition metal oxide for the variable resistance layer. It is to be noted that, here, the oxygen-deficient transition metal oxide is referred to an oxide for which x is represented by a non-stoichiometric ratio where a transition metal and an oxide are represented by A and $AO_x$, respectively, and whose oxygen is deficient against stoichiometry.

First, a first sample element is formed by interposing an oxygen-deficient tantalum oxide between a lower electrode (first electrode) and an upper electrode (second electrode), and a second sample element is formed by interposing an oxygen-deficient hafnium oxide between the same. Here, a material of the first electrode is fixed to W (tungsten), and a material of the second electrode is changed to various types of material shown in Tables 3 and 4. Tables 3 and 4 show compositions of the first sample element and the second sample element, respectively. It is to be noted that the reason why the material of the first electrode is fixed to W is that W is relatively difficult to oxidize, a stable material, and relatively easy to process.

TABLE 3

| Name of Element | Material of First Electrode | Material of Second Electrode |
|---|---|---|
| Ta-A | W | Pt |
| Ta-B | W | Ir |
| Ta-C | W | Ag |
| Ta-D | W | Cu |
| Ta-E | W | Ni |
| Ta-F | W | W |

TABLE 3-continued

| Name of Element | Material of First Electrode | Material of Second Electrode |
|---|---|---|
| Ta-G | W | Ta |
| Ta-H | W | Ti |
| Ta-I | W | Al |

TABLE 4

| Name of Element | Material of First Electrode | Material of Second Electrode |
|---|---|---|
| Hf-A | W | Pt |
| Hf-B | W | Cu |
| Hf-C | W | W |
| Hf-D | W | Ta |
| Hf-E | W | Hf |
| Hf-F | W | Ti |
| Hf-G | W | Al |

The inventors have examined resistance change of the first and second sample elements. In measurement of the resistance change of the first sample element shown in Table 3, although there are some differences depending on samples, a voltage pulse for high resistance writing is set to between +1.8 and +2.5 V and 100 ns, and a voltage pulse for low resistance writing is set to between −1.3 and −1.6 V and 100 ns. In the case of the second sample element shown in Table 4, a voltage pulse for high resistance writing is set to between +1.6 and +1.9 V and 100 ns, and a voltage pulse for low resistance writing is set to between −1.1 and −1.3 V and 100 ns.

FIGS. 6 to 21 show the measurement results of the elements shown in Tables 3 and 4. In addition, FIG. 5 sums up the measurement results. In other words, a total of 16 graphs shown in FIGS. 6 to 21 are miniaturized and arranged in FIG. 5.

Figure 5:
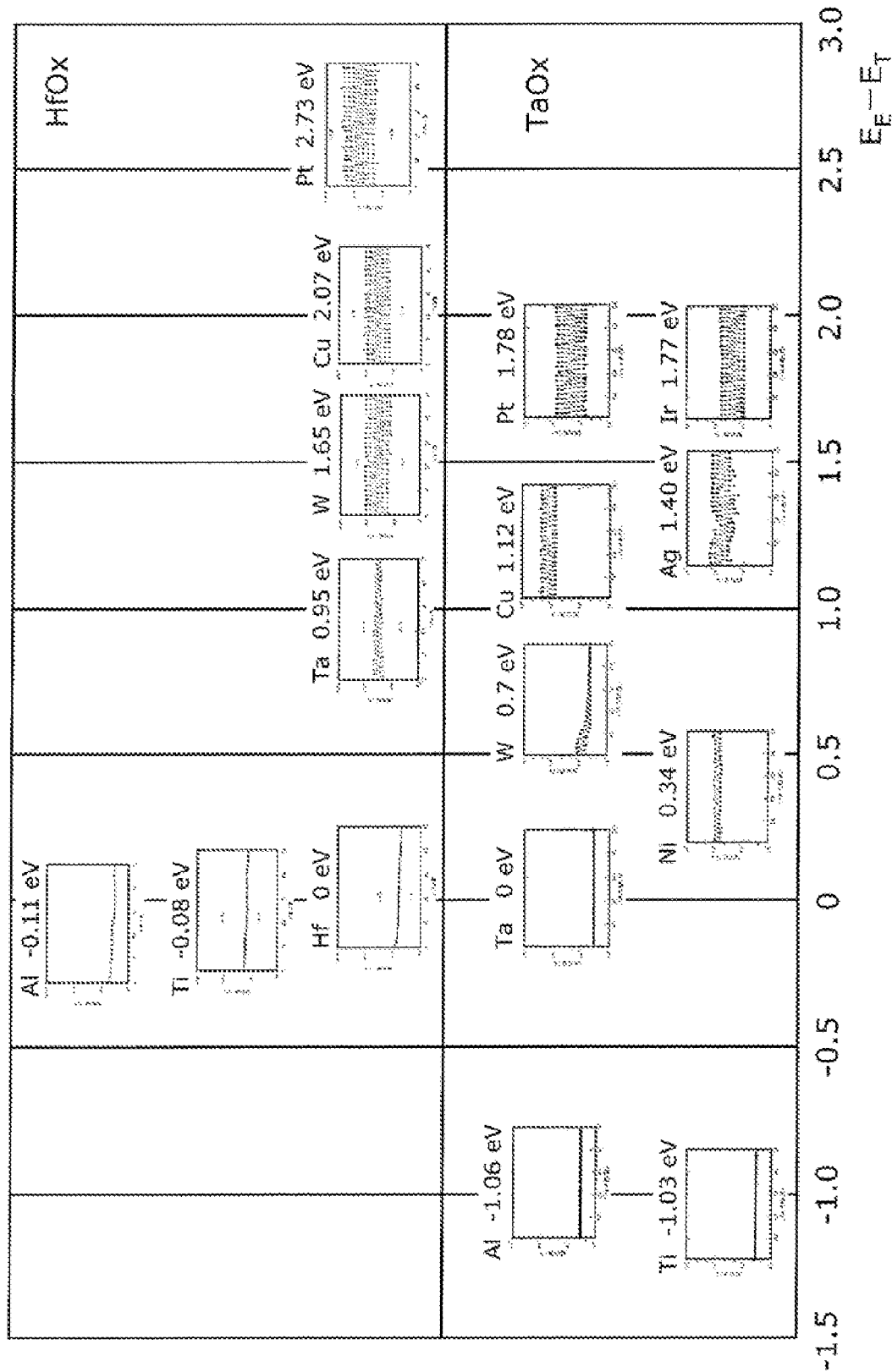
FIG. 5 is a graph showing (i) a difference between a standard electrode potential of a transition metal making up an oxygen-deficient transition metal oxide and a standard electrode potential of an electrode material and (ii) resistance change of an oxygen-deficient metal oxide.
Figure 6:
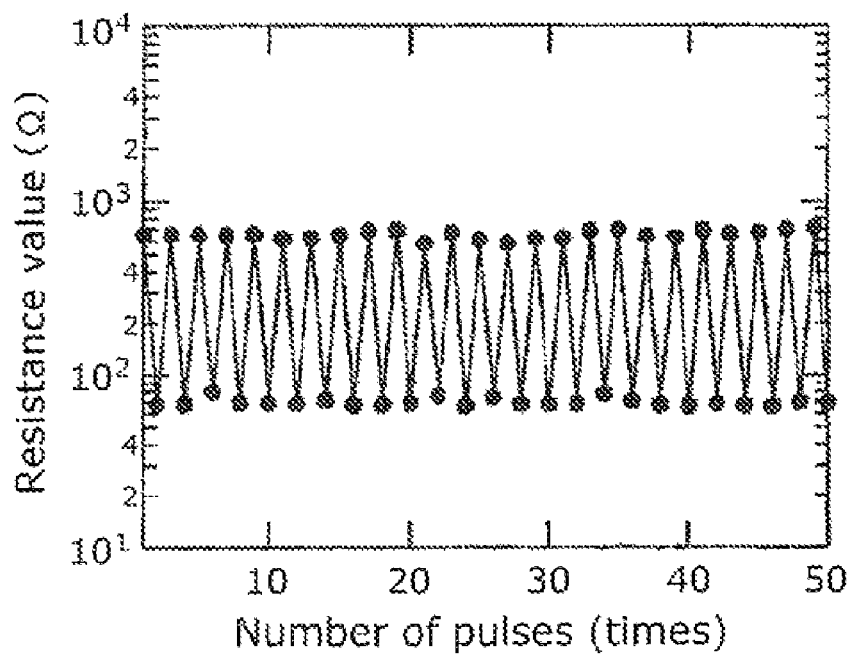
FIG. 6 is a diagram showing resistance change with respect to the number of times an electrical pulse is applied, when a second electrode is made of Pt in a nonvolatile memory element made of an oxygen-deficient tantalum oxide.
Figure 7:
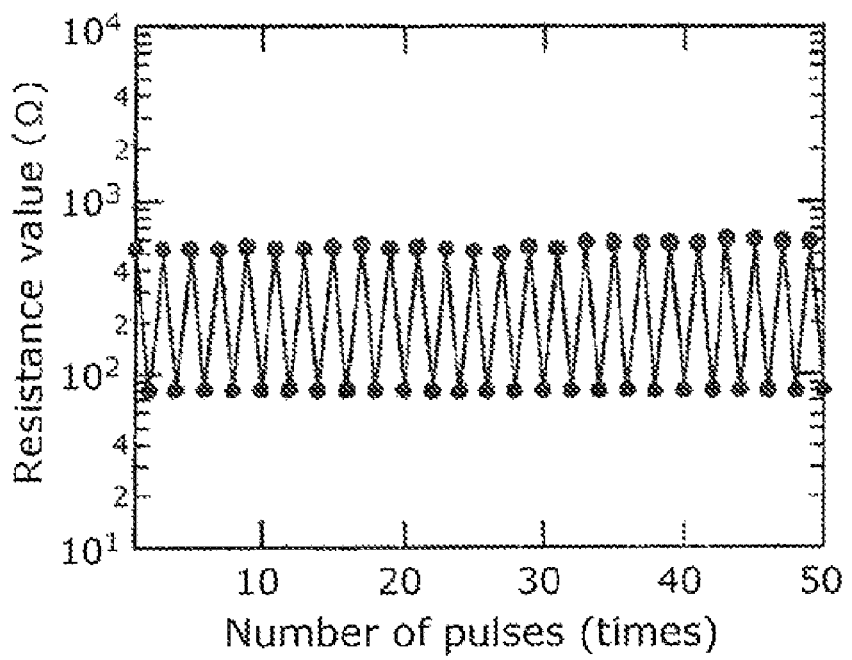
FIG. 7 is a diagram showing resistance change with respect to the number of times an electrical pulse is applied, when the second electrode is made of Ir in the nonvolatile memory element made of the oxygen-deficient tantalum oxide.
Figure 8:
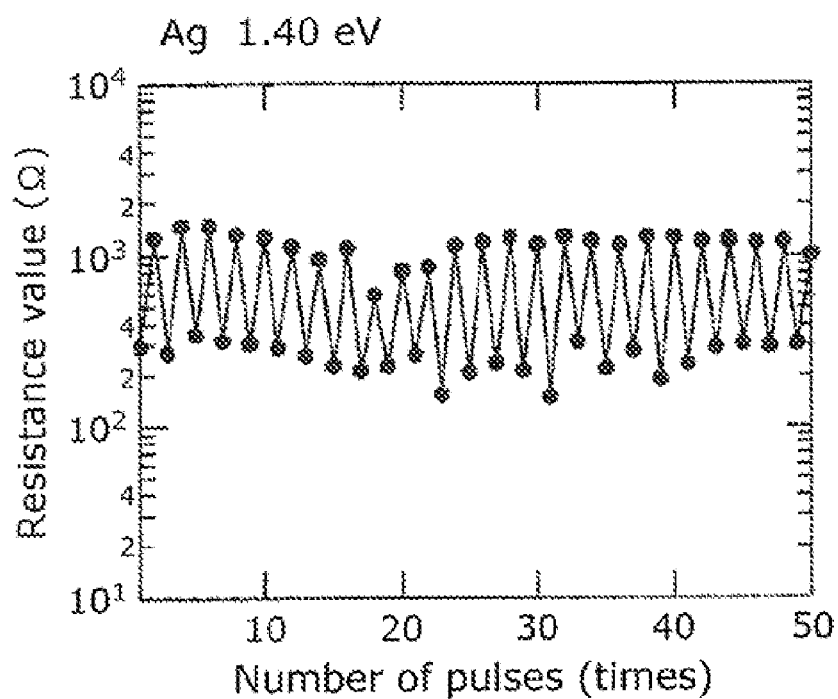
FIG. 8 is a diagram showing resistance change with respect to the number of times an electrical pulse is applied, when the second electrode is made of Ag in the nonvolatile memory element made of the oxygen-deficient tantalum oxide.

FIG. 5 is a graph showing a correlation between a difference ($E_E$–$E_T$) between a standard electrode potential $E_T$ of a transition metal making up an oxygen-deficient transition metal oxide and a standard electrode potential $E_E$ of an electrode material, and resistance change of the oxygen-deficient transition metal oxide (each of the arranged small graphs). The seven graphs arranged on the upper row of FIG. 5 show a correlation regarding the second sample element ($HfO_x$), and the nine graphs arranged on the bottom row of FIG. 5 show a correlation regarding the first sample element ($TaO_x$). Moreover, FIGS. 6 to 14 are graphs a showing resistance change in the first sample element according to the number of times a voltage pulse is applied. More specifically, each of FIGS. 6 to 14 shows a measurement result of a corresponding one of Ta-A (platinum), Ta-B (iridium), Ta-C (silver), Ta-D (copper), Ta-E (nickel), Ta-F (tungsten), Ta-G (tantalum), Ta-H (titanium), and Ta-I (aluminum). Furthermore, FIGS. 15 to 21 are graphs showing resistance change in the second sample element according to the number of times a voltage pulse is applied. More specifically, each of FIGS. 15 to 21 shows a measurement result of a corresponding one of Hf-A (platinum), Hf-B (copper), Hf-C (tungsten), Hf-D (tantalum), Hf-E (hafnium), Hf-F (titanium), and Hf-G (aluminum). It is to be noted that the upper portion of the graph shown in each of FIGS. 6 to 21 shows the material of the second electrode and ($E_E$–$E_T$).

As is clear from the graphs arranged on the left side of 0 eV with respect to the horizontal axis of FIG. 5, in the relationship between the standard electrode potential $E_E$ of the electrode material and the standard electrode potential $E_T$ of the transition metal making up the oxygen-deficient transition metal oxide, elements made of electrode materials satisfying $E_E$–$E_T$≦0 do not show a resistance change phenomenon.

To put it differently, as shown in FIGS. 5 and 12 to 14, the resistance change phenomenon is not observed at all in, among elements made of the oxygen-deficient tantalum oxide, an element Ta-G in which the second electrode is made of Ta, an element Ta-H in which the second electrode is made of Ti, and an element Ta-I in which the second electrode is made of Al.

Likewise, as shown in FIGS. 5 and 19 to 21, the resistance change phenomenon is not observed at all in, among elements made of the oxygen-deficient hafnium oxide, an element Hf-E in which the second electrode is made of Hf, an element Hf-F in which the second electrode is made of Ti, and an element Hf-G in which the second electrode is made of Al.

In contrast, as is clear from the graphs arranged on the right side of 0 eV with respect to the horizontal axis of FIG. 5, when a positive voltage pulse and a negative voltage pulse are repeatedly applied in an alternate manner, resistance values of elements made of electrode materials satisfying $E_E$–$E_T$>0 change accordingly, and it is verified that the elements has functioned in the same manner as a nonvolatile memory element. Thus, it is clear that the standard electrode potential of the second electrode layer 105 on the second oxide layer 104b is required to be higher than that of the second transition metal making up the second oxide layer 104b.

The following considers a stability of the resistance change of the elements showing the above resistance change.

Figure 9:
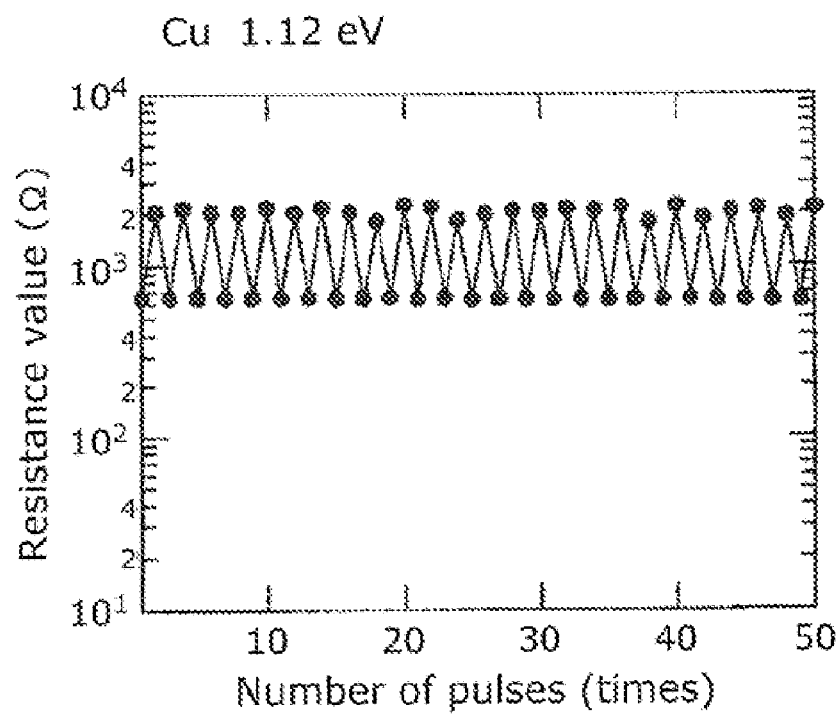
FIG. 9 is a diagram showing resistance change with respect to the number of times an electrical pulse is applied, when the second electrode is made of Cu in the nonvolatile memory element made of the oxygen-deficient tantalum oxide.
Figure 11:
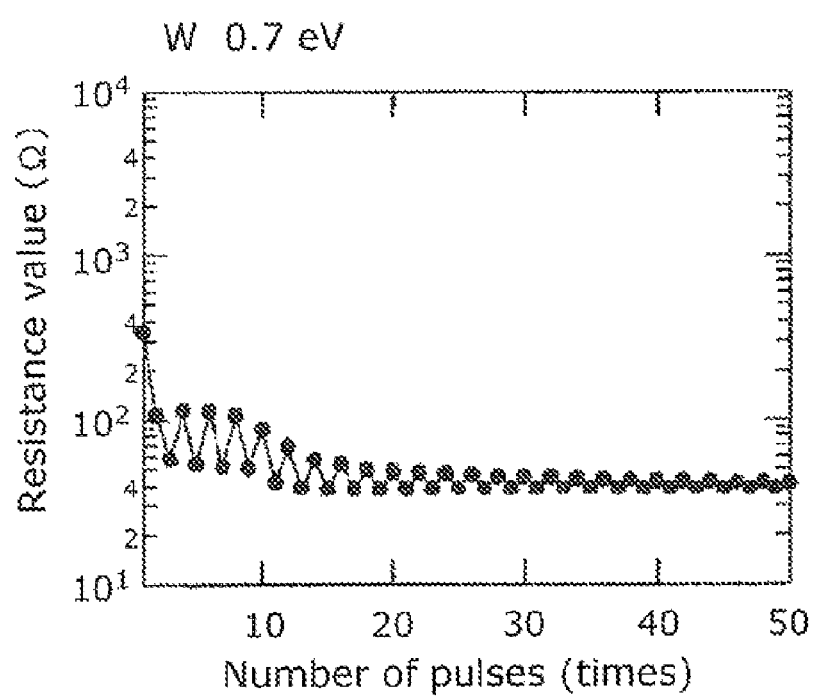
FIG. 11 is a diagram showing resistance change with respect to the number of times an electrical pulse is applied, when the second electrode is made of W in the nonvolatile memory element made of the oxygen-deficient tantalum oxide.

As shown in FIGS. 5 and 11, among the elements made of the oxygen-deficient tantalum oxide, an element Ta-F ($E_E$–$E_T$=0.7 eV) in which the second electrode is made of W shows little resistance change, but its variation range is small. In contrast, as shown in FIGS. 5 and 9, when the positive voltage pulse and the negative voltage pulse are repeatedly applied in an alternate manner, it is observed that a resistance value of an element Ta-D ($E_E$–$E_T$=1.12 eV) in which the second electrode is made of Cu has changed within a variation range of a single digit or above and more than 20 times, and it is clear that the resistance change has stably occurred. Likewise, as shown in FIGS. 5 to 8, when the positive voltage pulse and the negative voltage pulse are repeatedly applied in an alternate manner, it is observed that resistance values of an element Ta-A ($E_E$–$E_T$=1.78 eV) in which the second electrode is made of Pt, an element Ta-B ($E_E$–$E_T$=1.77 eV) in which the second electrode is made of Ir, and an element Ta-C ($E_E$–$E_T$=1.40 eV) in which the second electrode is made of Ag have changed within a variation range of a single digit or above and more than 20 times, and it is clear that the resistance change has stable occurred.

Figure 15:
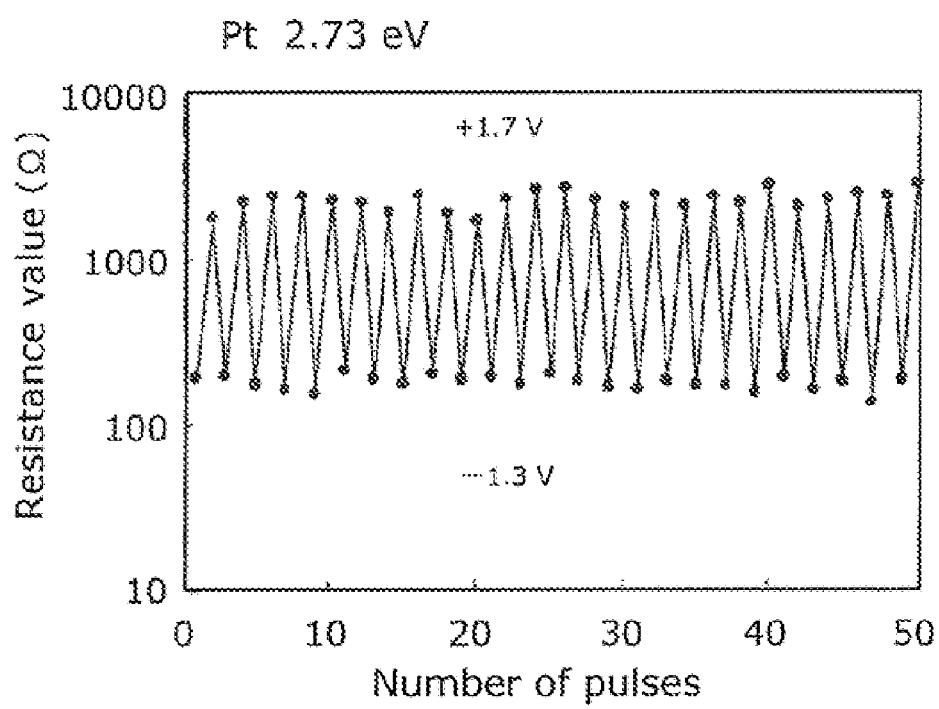
FIG. 15 is a diagram showing resistance change with respect to the number of times an electrical pulse is applied, when a second electrode is made of Pt in a nonvolatile memory element made of an oxygen-deficient hafnium oxide.
Figure 16:
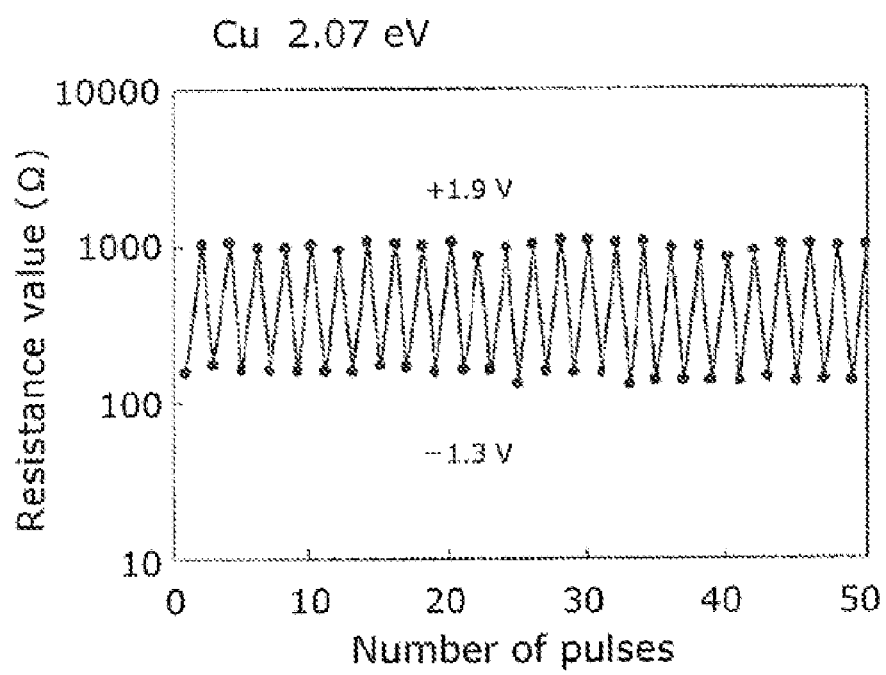
FIG. 16 is a diagram showing resistance change with respect to the number of times an electrical pulse is applied, when the second electrode is made of Cu in the nonvolatile memory element made of the oxygen-deficient hafnium oxide.
Figure 17:
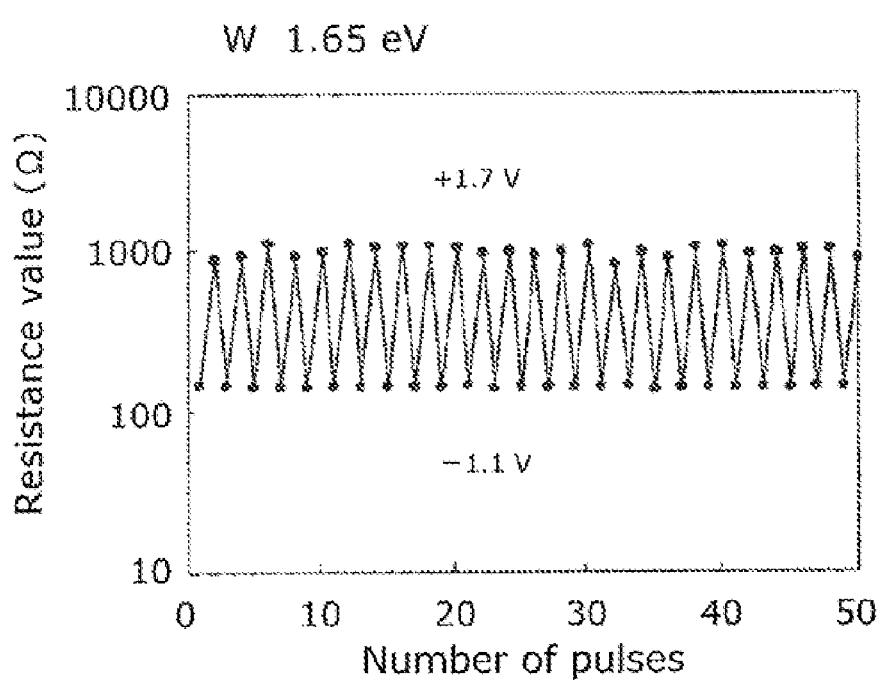
FIG. 17 is a diagram showing resistance change with respect to the number of times an electrical pulse is applied, when the second electrode is made of W in the nonvolatile memory element made of the oxygen-deficient hafnium oxide.
Figure 18:
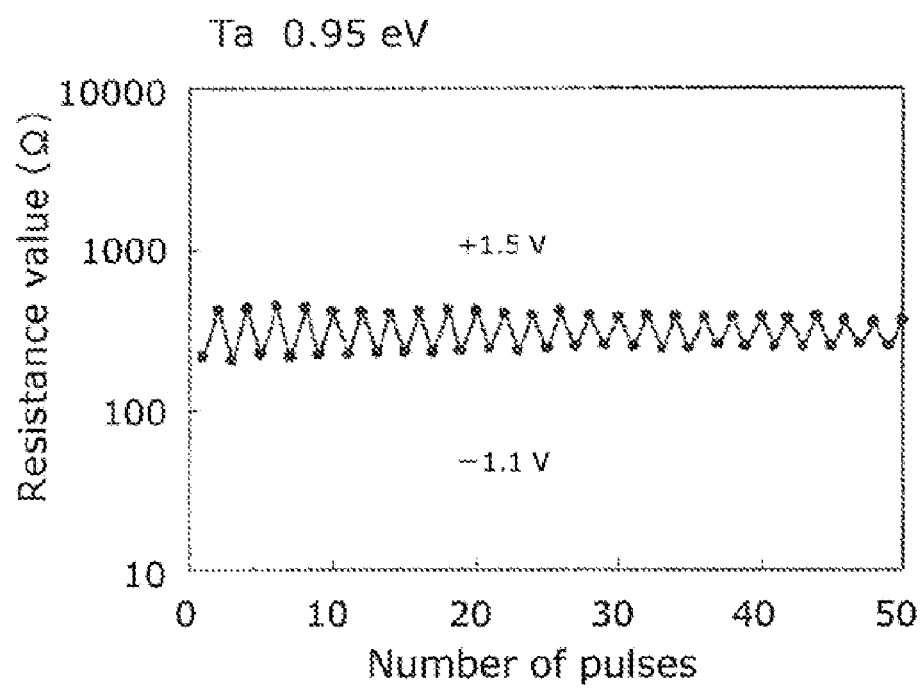
FIG. 18 is a diagram showing resistance change with respect to the number of times an electrical pulse is applied, when the second electrode is made of Ta in the nonvolatile memory element made of the oxygen-deficient hafnium oxide.
Figure 19:
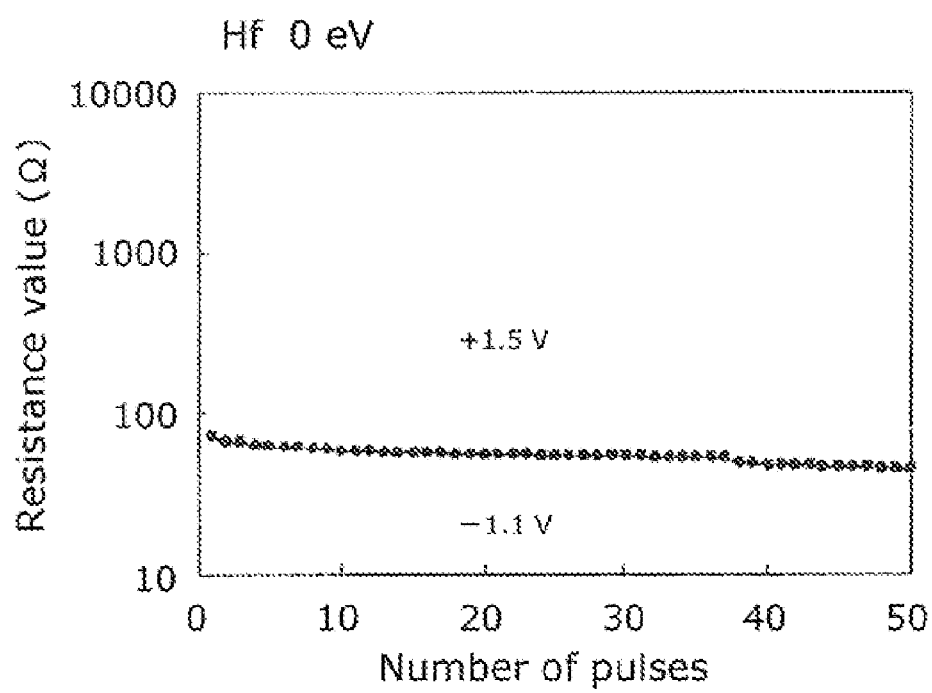
FIG. 19 is a diagram showing resistance change with respect to the number of times an electrical pulse is applied, when the second electrode is made of Hf in the nonvolatile memory element made of the oxygen-deficient hafnium oxide.
Figure 20:
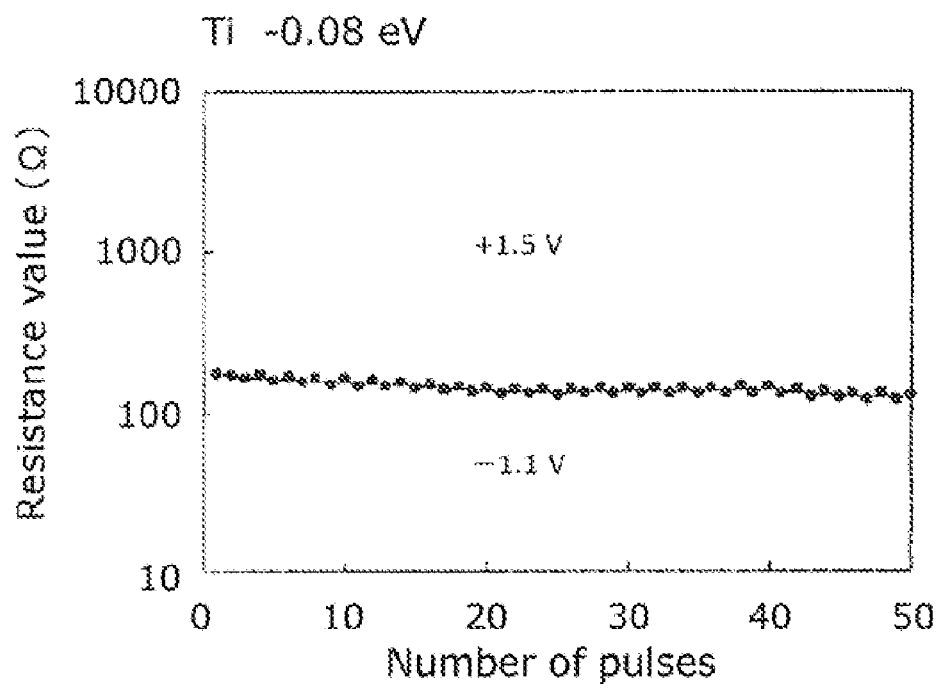
FIG. 20 is a diagram showing resistance change with respect to the number of times an electrical pulse is applied, when the second electrode is made of Ti in the nonvolatile memory element made of the oxygen-deficient hafnium oxide.
Figure 21:
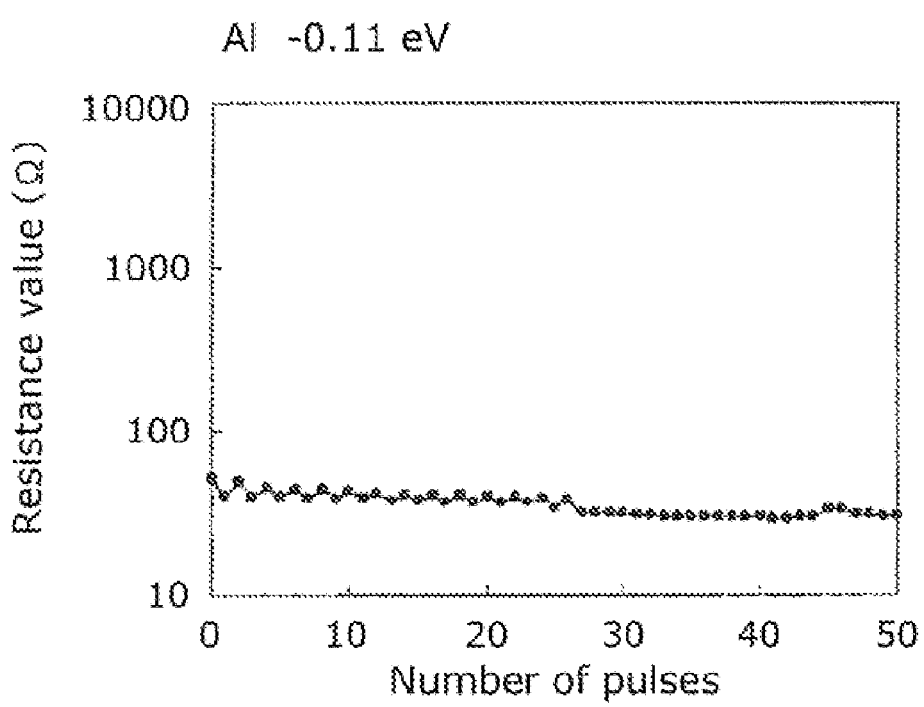
FIG. 21 is a diagram showing resistance change with respect to the number of times an electrical pulse is applied, when the second electrode is made of Al in the nonvolatile memory element made of the oxygen-deficient hafnium oxide.

Moreover, as shown in FIGS. 5 and 18, among the elements made of the oxygen-deficient hafnium oxide, an element Hf-D ($E_E$–$E_T$=0.95 eV) in which the second electrode is made of Ta shows little resistance change, but its variation range is small. In contrast, as shown in FIGS. 5 and 17, when the positive voltage pulse and the negative voltage pulse are repeatedly applied in an alternate manner, it is observed that a resistance value of an element Hf-C ($E_E$–$E_T$=1.65 eV) in which the second electrode is made of W has changed within a variation range of a single digit or above and more than 20 times, and it is clear that the resistance change has stably occurred. Likewise, as shown in FIGS. 5, 15, and 16, when the positive voltage pulse and the negative voltage pulse are repeatedly applied in an alternate manner, it is observed that resistance values of an element Hf-A ($E_E$–$E_T$=2.73 eV) in which the second electrode is made of Pt and an element Hf-B ($E_E$–$E_T$=2.07 eV) in which the second electrode is made of Cu have changed within a variation range of a single digit or above and more than 20 times, and it is clear that the resistance change has stably occurred.

Figure 10:
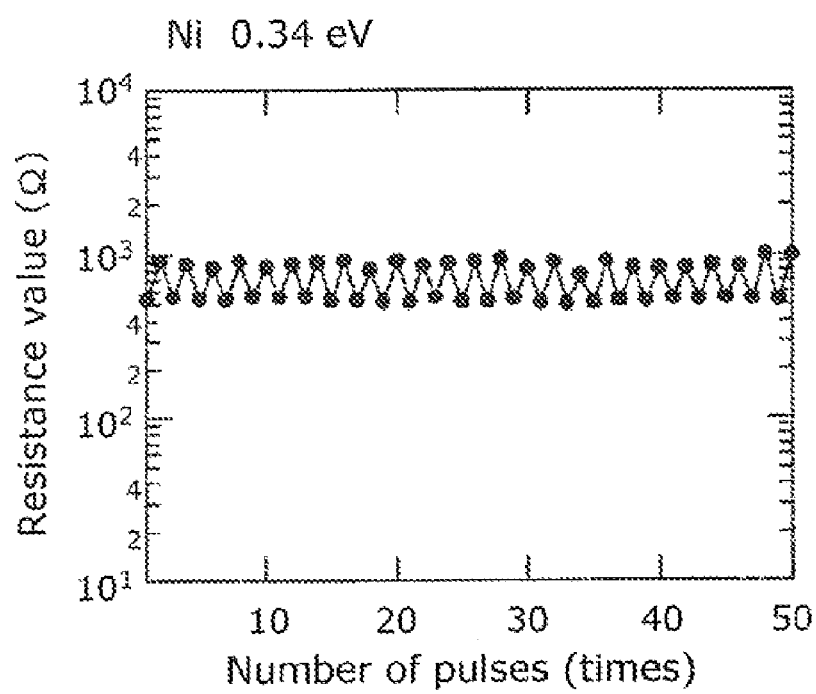
FIG. 10 is a diagram showing resistance change with respect to the number of times an electrical pulse is applied, when the second electrode is made of Ni in the nonvolatile memory element made of the oxygen-deficient tantalum oxide.
Figure 12:
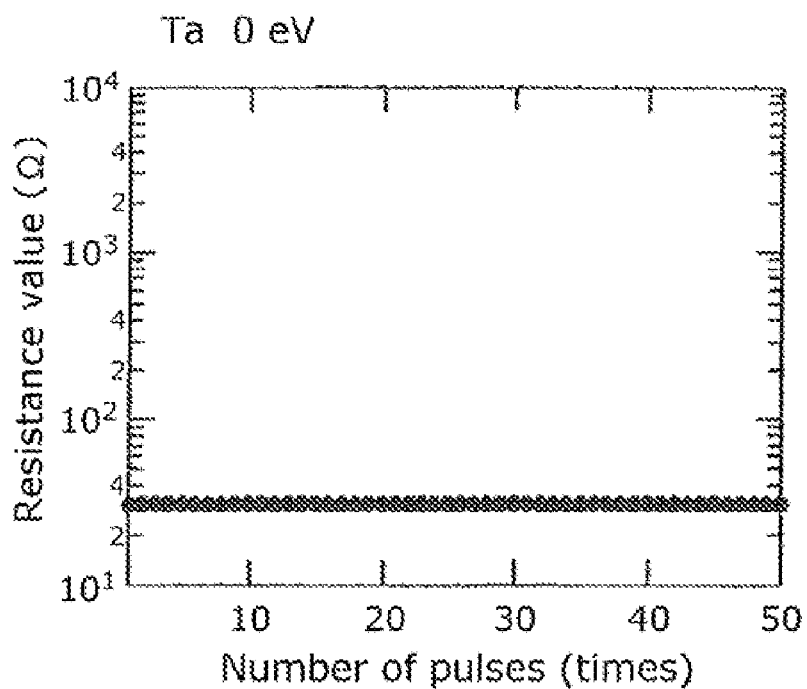
FIG. 12 is a diagram showing resistance change with respect to the number of times an electrical pulse is applied, when the second electrode is made of Ta in the nonvolatile memory element made of the oxygen-deficient tantalum oxide.
Figure 13:
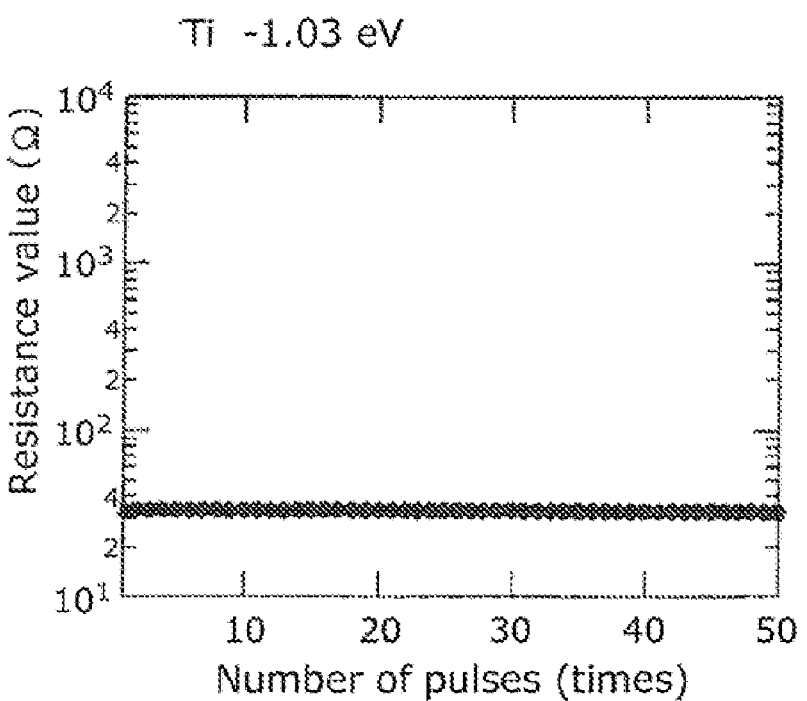
FIG. 13 is a diagram showing resistance change with respect to the number of times an electrical pulse is applied, when the second electrode is made of Ti in the nonvolatile memory element made of the oxygen-deficient tantalum oxide.
Figure 14:
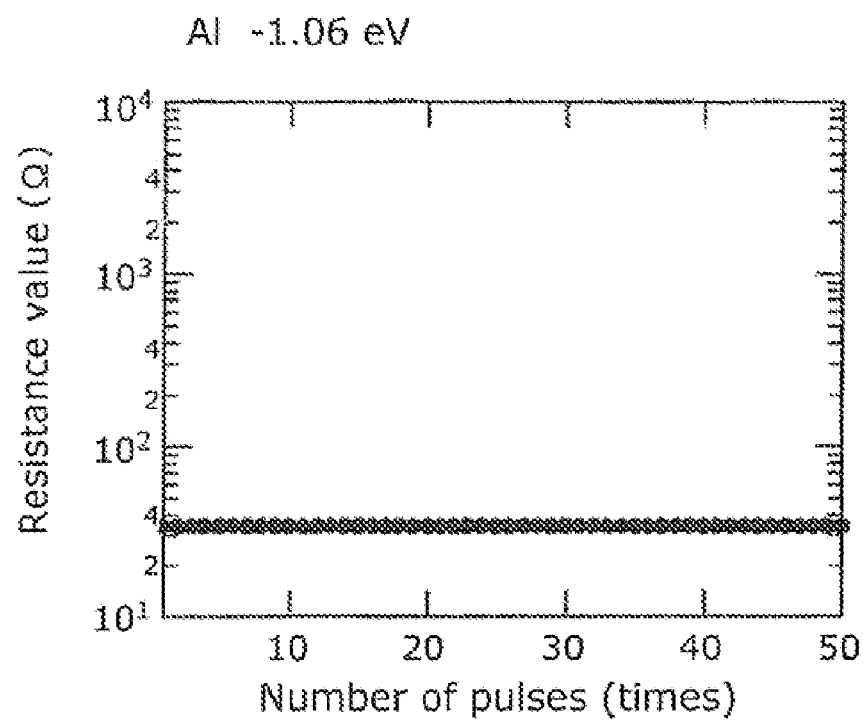
FIG. 14 is a diagram showing resistance change with respect to the number of times an electrical pulse is applied, when the second electrode is made of Al in the nonvolatile memory element made of the oxygen-deficient tantalum oxide.

Here, as shown in FIGS. 5 and 12, the resistance change phenomenon is not observed at all in the element Ta-G ($E_E-E_T=0$ eV) in which the second electrode is made of Ta among the elements made of the oxygen-deficient tantalum oxide, whereas, as shown in FIGS. 5 and 10, an element Ta-E ($E_E-E_T=0.34$ eV) in which the second electrode is made of Ni shows little resistance change. For this reason, it is considered preferable to satisfy the condition $E_E-E_T=0.34$ eV (or the condition $E_E-E_T\geqq 0.34$ eV) so that the elements made of, the oxygen-deficient tantalum oxide perform a resistance change operation.

Furthermore, as shown in FIGS. 5 and 11, the element Ta-F ($E_E-E_T=0.7$ eV) in which the second electrode is made of W shows little resistance change but its variation range is small, whereas, as shown in FIGS. 5 and 9, it is verified that the resistance value of the element Ta-D ($E_E-E_T=1.12$ eV) in which the second electrode is made of Cu has changed within a variation range of a single digit or above and more than 20 times. For this reason, it is considered preferable to satisfy the condition $E_E-E_T=1.12$ eV (or the condition $E_E-E_T\geqq 1.12$ eV) so that the elements made of the oxygen-deficient tantalum oxide stably perform the resistance change operation.

Moreover, as shown in FIGS. 5 and 18, the element Hf-D ($E_E-E_T=0.95$ eV) in which the second electrode is made of Ta shows little resistance change but its variation range is small, whereas, as shown in FIGS. 5 and 17, it is verified that the resistance value of the element Hf-C ($E_E-E_T=1.65$ eV) in which the second electrode is made of W has changed within the variation range of the single digit or above and more than 20 times, as stated above. For this reason, it is considered preferable to satisfy the condition $E_E-E_T=1.65$ eV (or $E_E-E_T\geqq 1.65$ eV) so that the elements made of the oxygen-deficient hafnium oxide stably perform the resistance change operation.

As stated above, the relationship between the standard electrode potential of the transition metal making up the oxygen-deficient transition metal oxide and the standard electrode potential of the electrode material plays an important role in achieving the stable resistance change operation of the elements.

As shown in FIG. 5, when the resistance change of the oxygen-deficient transition metal oxide is plotted with respect to the difference between the standard electrode potential of the transition metal making up the oxygen-deficient transition metal oxide and the standard electrode potential of the electrode material, it is possible to verify that there is a good correlation between the standard electrode potentials. In other words, it is clear that resistance change occurs when an electrode is made of a material having a higher standard electrode potential than Ta and Hf which are transition metals making up a variable resistance layer, and that, conversely, the resistance change does not easily occur when the electrode is made of a material having a lower standard electrode potential than Ta and Hf. In addition, it is clear that the larger the difference between the standard electrode potential of the transition metal and the standard electrode potential of the electrode material is, the more easily the resistance change occurs, and that, conversely, the smaller the difference is, the more easily the resistance change does not occur.

This tallies with the above-mentioned inference about the resistance change mechanism. Stated differently, as mentioned above, it can be considered that the resistance change easily occurs when the transition metal included in the variable resistance layer is easy to oxidize, and thus it is possible to achieve the stable resistance change operation by using, to an interface of an electrode side of a variable resistance layer, an oxide layer including a transition metal which is easy to oxidize in comparison with an electrode material (that is, having a lower standard electrode potential). Therefore, it is not only preferable that the standard electrode potential of the second electrode is higher than that of the transition metal making up the second oxide layer, but also preferable that the standard electrode potential of the second electrode is higher than that of the transition metal making up the first oxide layer.

As described above, it is preferable that, in the nonvolatile memory element 100 according to the present embodiment, the second electrode layer 105 is made of a material having a higher standard electrode potential than the transition metal making up the second oxide layer 104b. For instance, the transition metal making up the second oxide layer 104b is Ti in the present embodiment, and it is preferable to use a material having a larger standard electrode potential than Ti. More specifically, it is possible to use W, Cu, and Ni, for example. It is possible to use W, Cu, Ni, or the like as a material of the second electrode layer 105 because, although W, Cu, Ni, or the like does not have a higher standard electrode potential than noble metal electrode materials such as Au, Pt, and Ir, the standard electrode potential of Ti is relatively low. It is possible to reduce manufacturing costs of the nonvolatile memory element 100 because W, Cu, Ni, or the like is a low-cost material having compatibility with semiconductor processing.

(Structure in which Load Element is Connected)

There is a case where a nonvolatile memory element is connected in series with a load element such as a fixed resistor, a transistor, and a diode (specific examples of this case will be described in Embodiments 2 and 3). When the load element is thus connected, there occurs a problem that a breakdown voltage in this case is higher than that in a case of the nonvolatile memory element by itself. This is because occurrence of voltage drop in the load element reduces a voltage to be effectively applied to the nonvolatile memory element.

The inventors have performed the following experiment to check the above problem.

It is to be noted that an experimental nonvolatile memory element (hereinafter, referred to as an experimental element) is formed in the following manner. First, a TaN thin film is formed as a first electrode layer on an oxide layer formed on a silicon substrate, and a first tantalum oxide layer is further formed on the TaN thin film by reactive sputtering using a Ta target. Next, a second tantalum oxide layer which has a higher oxygen content percentage than the first tantalum oxide layer is formed by oxidizing, with oxygen plasma, the top surface of the first tantalum oxide layer. Subsequently, by sputtering, an Ir thin film is formed on the second tantalum oxide layer as a second electrode layer. Through such processing, the experimental element is formed by stacking the first electrode layer, the first tantalum oxide layer ($TaO_{1.6}$), the second tantalum oxide layer ($TaO_{2.47}$), and the second electrode layer.

In the experimental element, a variable resistance layer includes the first tantalum oxide layer and the second tantalum oxide layer having a higher resistance state than the first tantalum oxide layer.

FIGS. 22 (a) and (b) are graphs showing electric characteristics of the experimental element by itself (that is, when the load element is not connected to the experimental element) when a thickness of the second tantalum oxide layer is 3 nm, and FIGS. 22 (a) and (b) show current (vertical axis)- voltage (horizontal axis) characteristics and resistance (vertical axis)-voltage (horizontal axis) characteristics, respectively. FIGS. 23 (a) and (b) are also graphs showing electric characteristics of the experimental element when a thickness of the second tantalum oxide layer is also 3 nm and when the load element is connected to the experimental element, and FIGS. 23 (a) and (b) show current (vertical axis)-voltage (horizontal axis) characteristics and resistance (vertical axis)-voltage (horizontal axis) characteristics, respectively. It is to be noted that FIG. 22 (b) and FIG. 23 (b) show a resistance value measured at 50 mV.

As is clear by reference to FIGS. 22 (a) and (b), when the experimental element is not connected with the load element, resistance change starts as a voltage of about −1 V is applied. In other words, in this case, a breakdown voltage is about −1 V. In contrast, as is clear by reference to FIGS. 23 (a) and (b), when the load element (here, 1 kΩ resistance) is connected to the experimental element, the resistance change does not start unless an applied voltage is increased to about −3.5 V. In other words, in this case, the breakdown voltage is about −3.5 V. As shown in FIG. 22 (a), when the voltage of about −1 V at which the resistance change starts is applied, a leakage current of about 2.5 mA flows. On the other hand, in the situation where the load element is connected to the experimental element, voltage drop corresponding to an amount of current flowing in the load element occurs when the leakage current is large, and a voltage to be effectively applied to the experimental element is reduced accordingly. Thus, as stated above, the resistance change does not start unless the applied voltage is increased to about −3.5 V.

Figure 24:
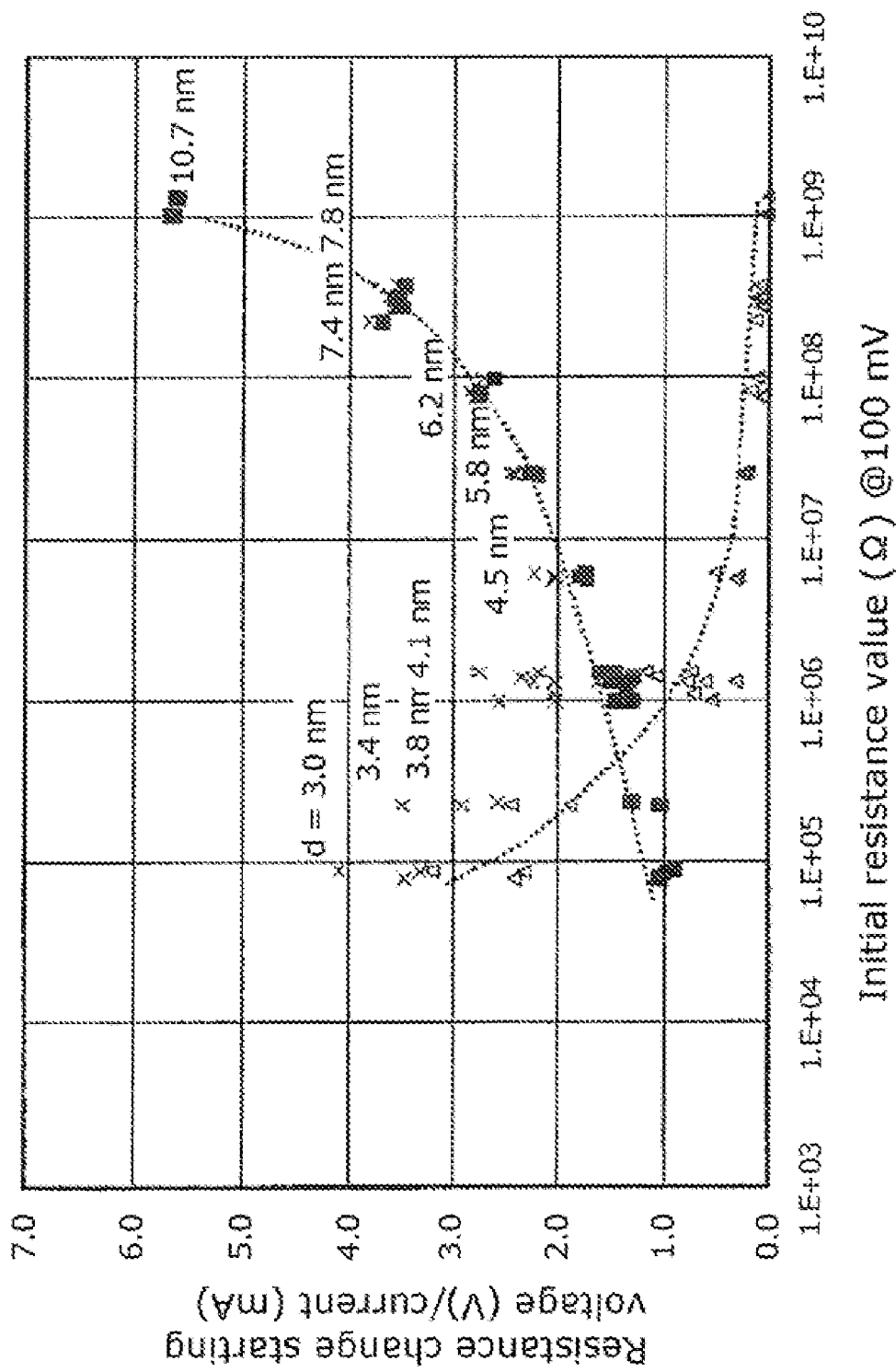
FIG. 24 is a graph showing a relationship between an initial resistance value of a variable resistance layer and a breakdown voltage when a thickness d of a second tantalum oxide layer is varied, and a relationship between the initial resistance value and a leakage current.

FIG. 24 is a graph showing a relationship between an initial resistance value of a variable resistance layer and a breakdown voltage when a thickness d of a second tantalum oxide layer is varied, and a relationship between the initial resistance value and a leakage current. The horizontal axis indicates the initial resistance value of the variable resistance layer measured at an applied voltage of 100 mV, and the vertical axis indicates either the breakdown voltage or the leakage current flowing at a time of breakdown. It is to be noted that, in FIG. 24, cross plot points, solid square plot points, and triangular plot points represent a breakdown voltage when the load element is connected to the experimental element, a breakdown voltage when the experimental element is not connected with the load element, and a current value of a leakage current (common to when the load element is connected to the experimental element and when the experimental element is not connected with the load element), respectively.

As shown in FIG. 24, when the experimental element is not connected with the load element (the solid squire plot points), the less the thickness d of the second tantalum oxide layer is, the lower the breakdown voltage is. This seems to indicate that start of the resistance change is controlled by an electric field. In contrast, when the load element is connected to the experimental element (the cross plot points), it is clear that reducing the thickness d of the second tantalum oxide layer up to about 4.5 nm reduces a breakdown voltage in a similar manner as the breakdown voltage of the experimental element not connected with the load element, but it is also clear that reducing it beyond 4.5 nm increases a leakage current and the breakdown voltage is larger than that of the experimental element not connected with the load element. This indicates that if the leakage current can be decreased, it is possible to suppress the increase of the breakdown voltage and allow the start of the resistance change even in the situation where the experimental element is connected with the load element.

As described above, the reduction in the breakdown voltage is required more in the structure where the load element is connected to the nonvolatile memory element than in the structure where the load element is not connected to the same. In the case of the nonvolatile memory element 100 according to the present embodiment, the breakdown voltage can be reduced by selecting the materials of the variable resistance layer and the electrodes in the above manner, and thus it is possible to meet such a requirement.

(Conduction Band Offset)

Table 1 shows a conduction band offset (eV) with respect to Si as one of the physical properties of the materials. As stated above, the leakage current is generated when the nonvolatile memory element is connected with the load element, but the leakage current can be reduced by forming the second oxide layer using a material having a large conduction band offset value.

Thus, from this point of view, it is preferable to form the second oxide layer 104b using not Ta having a relatively small conduction band offset value but Ti, Sr, Nb, or the like having a relatively large conduction band offset value. In other words, it is clear that Ti, Sr, or Nb is preferable as the metal making up the second oxide layer 104b, not only from a point of view of a dielectric constant value and a band gap of the second oxide layer 104b, but also from a point of view of the conduction band offset value.

Embodiment 2

Next, a nonvolatile memory device according to Embodiment 2 of the present invention shall be described.

The nonvolatile memory element 100 according to the above-mentioned Embodiment 1 can be applied to various forms of nonvolatile memory device. The nonvolatile memory device according to Embodiment 2 is a nonvolatile memory device including the nonvolatile memory element according to Embodiment 1, and is a so-called crosspoint nonvolatile memory device in which the nonvolatile memory element is interposed at a crosspoint (three-dimensional crosspoint) between a word line and a bit line.

(Structure of Nonvolatile Memory Device)

Figure 25:
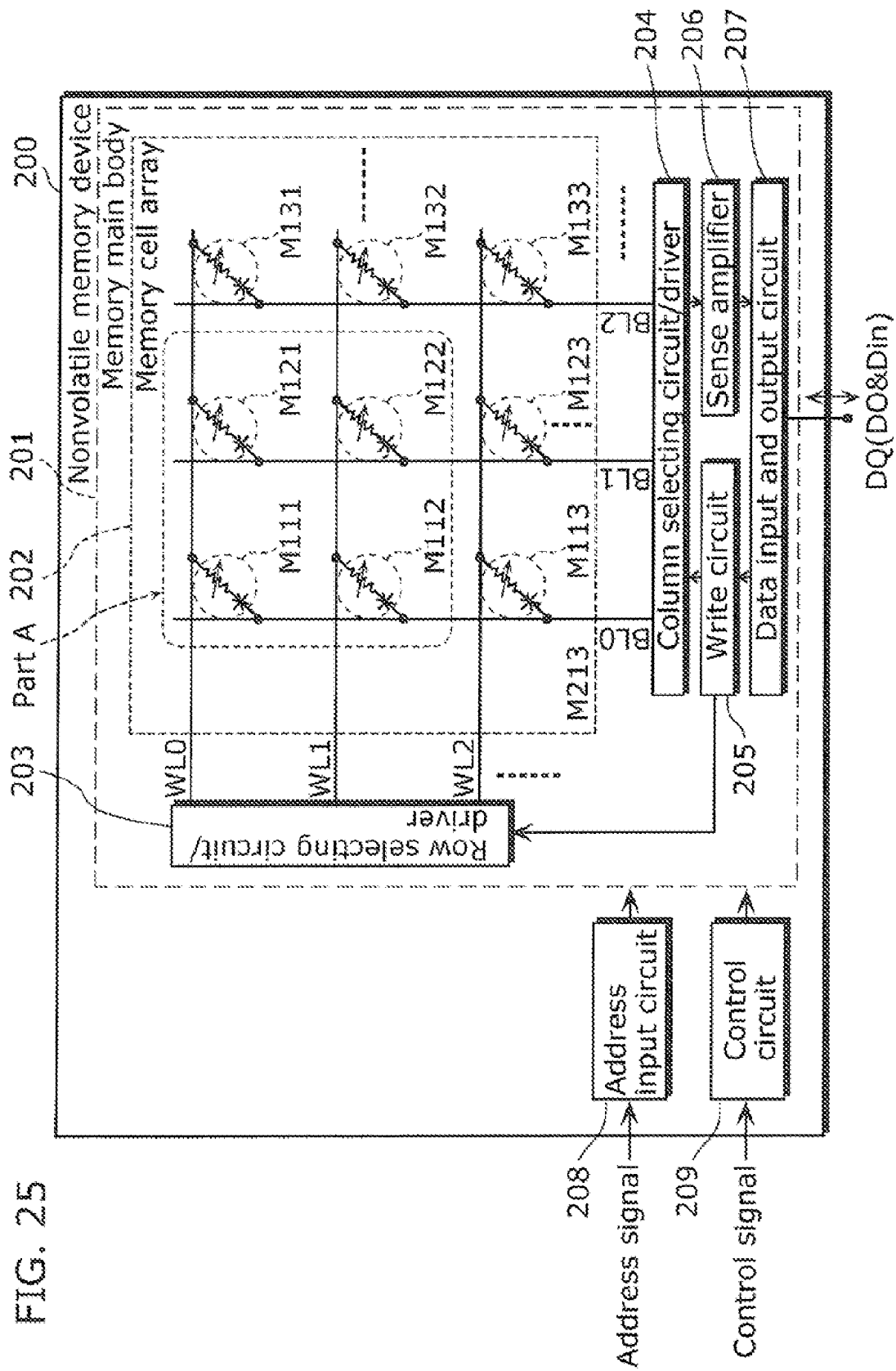
FIG. 25 is a block diagram showing a structure of a nonvolatile memory device according to Embodiment 2 of the present invention.

FIG. 25 is a block diagram showing a structure of a nonvolatile memory element 200 according to Embodiment 2 of the present invention. Furthermore, FIG. 26 is a perspective view showing a structure of part A (physical structure of a memory cell for four bits) shown in FIG. 25.

As shown in FIG. 25, the nonvolatile memory device 200 according to the present embodiment includes a memory main body 201 on a semiconductor substrate. The memory main body 201 includes: a memory cell array 202; a row selection circuit/driver 203, a column selection circuit/driver 204; a write circuit 205 for writing data; a sense amplifier 206 which detects an amount of current flowing in a selected bit line and determines whether the data indicates "1" or "0"; and a data input and output circuit 207 which performs input and output processing of input and output data via a terminal DQ.

In addition, the nonvolatile memory device 200 further includes: an address input circuit 208 which receives address signals inputted from the outside; and a control circuit 209 which controls operations of the memory main body 201 based on a control signal inputted from the outside.

Figure 26:
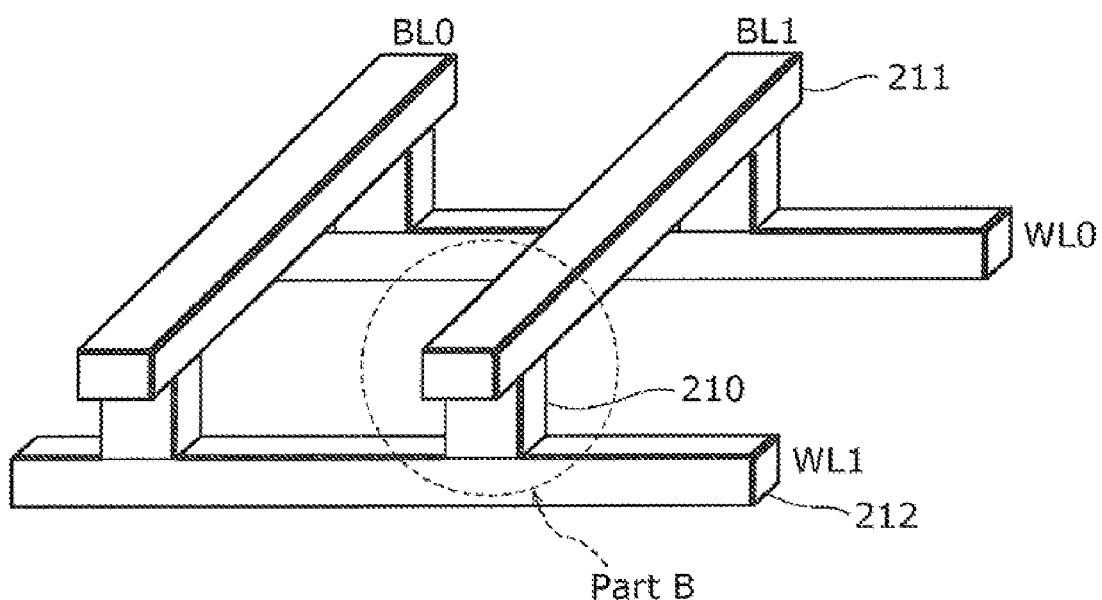
FIG. 26 is a perspective view showing a structure of part A (structure for four bits) shown in FIG. 25.

As shown in FIGS. 25 and 26, the memory cell array 202 includes: word lines WL0, WL1, WL2, . . . which are formed parallel to each other on the semiconductor substrate; and bit lines BL0, BL1, BL2, . . . which are formed above the word lines WL0, WL1, WL2, . . . so as to be parallel to each other on a plane that is parallel to a principal plane of the semiconductor substrate and to three-dimensionally cross the word line WL0, WL1, WL2, . . . .

Furthermore, memory cells M111, M12, M113, M121, M122, M123, M131, M132, M133, . . . (hereinafter, referred to as "memory cells M111, M112, . . . ") are provided in a matrix where each of the memory cells M111, M112, . . . corresponds to a crosspoint between corresponding ones of the word lines WL0, WL1, WL2, . . . and the bit lines BL0, BL1, BL2, . . . .

Here, each of the memory cells M111, M112, . . . corresponds to the nonvolatile memory element 100 according to Embodiment 1. However, in the present embodiment, each of the memory cells M111, M112, . . . includes a current controlling element connected in series with the nonvolatile memory element 100 as described later.

It is to be noted that each of the memory cells M111, M112, . . . in FIG. 25 is shown using the reference numeral 210.

The address input circuit 208 receives address signals from an external circuit (not shown), and outputs row address signals to the row selection circuit/driver 203 and column address signals to the column selection circuit/driver 204, based on the address signals. Here, the address signals are signals indicating an address of a specific memory cell to be selected from among the memory cells M111, M112, . . . included in the memory cell array 202. Moreover, the row address signals are signals indicating an address of a row which is a part of the address indicated by the address signals, and the column address signals are signals indicating an address of a column which is also a part of the address indicated by the address signals.

In a data write cycle, the control circuit 209 outputs, to the write circuit 205, a write command signal instructing application of voltage for writing, according to input data Din inputted to the data input and output circuit 207. On the other hand, in a data read cycle, the control circuit 209 outputs, to the column selection circuit/driver 204, a read command signal instructing read operation.

The row selection circuit/driver 203 receives the row address signals outputted from the address input circuit 208, selects one of the word lines WL0, WL1, WL2, . . . according to the row address signals, and applies a predetermined voltage to the selected word line. In other words, the row selection circuit/driver 203 is an example of a selection circuit which selects at least one nonvolatile memory element from among the nonvolatile memory elements included in the memory cell array 202.

Furthermore, the column selection circuit/driver 204 receives the column address signals outputted from the address input circuit 208, selects one of the bit lines BL0, BL1, BL2, . . . according to the column address signals, and applies a voltage for writing or a voltage for reading to the selected bit line. In other words, the column selection circuit/driver 204 is the example of the selection circuit which selects the at least one nonvolatile memory element from among the nonvolatile memory elements included in the memory cell array 202.

When receiving the write command signal outputted from the control circuit 209, the write circuit 205 outputs, to the row selection circuit/driver 203, a signal instructing application of voltage to the selected word line, and outputs, to the column selection circuit/driver 204, a signal instructing application of voltage for writing to the selected bit line. To put it differently, the write circuit 205 is an example of a write circuit which writes data by applying a voltage to the nonvolatile memory element (here, the memory cell) selected by the selection circuit (the row selection circuit/driver 203 and the column selection circuit/driver 204).

Moreover, in the data read cycle, the sense amplifier 206 detects an amount of current flowing in the selected bit line to be read, and determines whether data Indicates "1" or "0". The resultant output data DO is outputted to the external circuit via the data input and output circuit 207. Stated differently, the sense amplifier 206 is an example of a readout circuit which reads data by detecting a resistance value of the nonvolatile memory element which is included in the memory cell selected by the selection circuit (the row selection circuit/driver 203 and the column selection circuit/driver 204). As the readout circuit, a sense amplifier which measures a time constant of an RC circuit may be used in place of the above sense amplifier 206, the RC circuit including the resistance value of the nonvolatile memory element and capacitance formed in the readout circuit.

It is to be noted that it is also possible to realize a multi-stacked nonvolatile memory device by three-dimensionally stacking the memory cell array 202 included in the nonvolatile memory device 200 according to the present embodiment shown in FIGS. 25 and 26. It is possible to realize an ultrahigh capacity nonvolatile memory by providing the multi-stacked memory cell array thus formed.

(Structure of Nonvolatile Memory Element)

Figure 27:
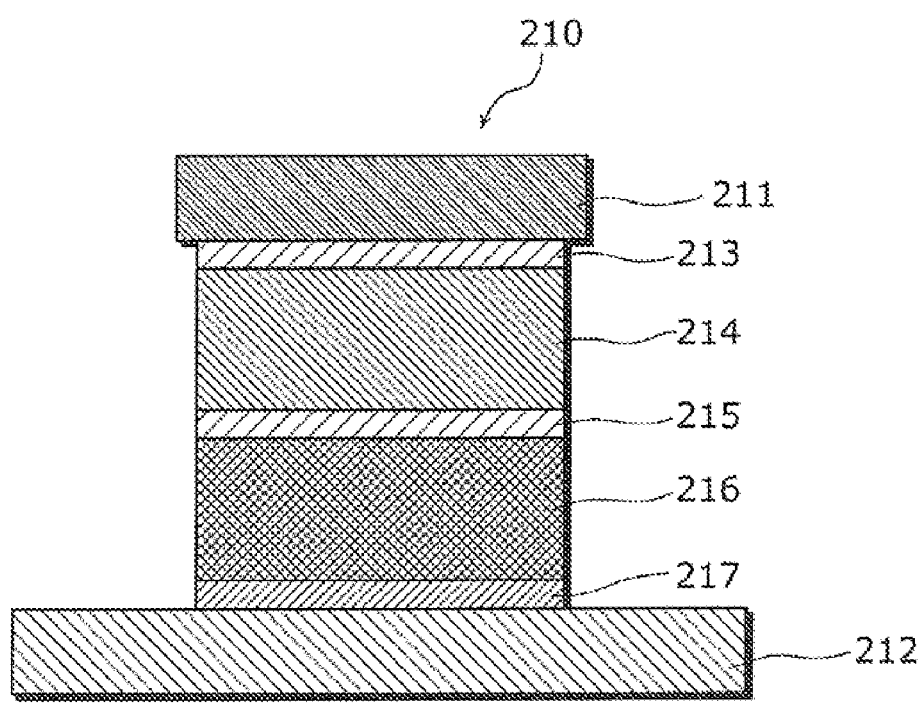
FIG. 27 is a cross-sectional view showing a structure of a nonvolatile memory element included in the nonvolatile memory device according to Embodiment 2 of the present invention.

FIG. 27 is a cross-sectional view showing a structure of a memory cell (here, the nonvolatile memory element 210 including a current controlling element as a load element) included in the nonvolatile memory device 200 according to Embodiment 2 of the present invention. It is to be noted that FIG. 27 shows a structure of part B (one crosspoint) of FIG. 26.

As shown in FIG. 27, the nonvolatile memory element 210 included in the nonvolatile memory device according to the present embodiment is placed between a lower wire 212 (corresponding to the word line WL1 in FIG. 26) which is a copper wire and an upper wire 211 (corresponding to the bit line BL1 in FIG. 26) which is also a copper wire. The nonvolatile memory element 210 is formed by stacking a lower electrode 217, a current controlling element 216, an inner electrode 215, a variable resistance layer 214, and an upper electrode 213 in this order.

Here, the inner electrode 215, the variable resistance layer 214, and the upper electrode 213 correspond respectively to the first electrode layer 103, the variable resistance layer 104, and the second electrode layer 105 included in the nonvolatile memory element 100 according to Embodiment 1 shown in FIG. 1. Thus, the variable resistance layer 214 is formed in the same manner as the variable resistance layer 104 described in Embodiment 1.

The current controlling element 216 is an example of the load element connected in series with the variable resistance layer 214 via the inner electrode 215. The current controlling element 216 is an element which is typified by a diode and controls a current, and shows nonlinear current characteristics with respect to a voltage. Furthermore, the current controlling element 216 has bi-directional current characteristics with respect to a voltage, and is configured to be conductive at a predetermined threshold voltage Vf (+1 V or higher or −1 V or lower with reference to one of electrodes, for example).

(Operations of Nonvolatile Memory Device)

Next, example operations of the nonvolatile memory device 200 according to the present embodiment in a write cycle when data is written and in a read cycle when data is read shall be described with reference to a timing diagram shown in FIG. 28.

Figure 28:
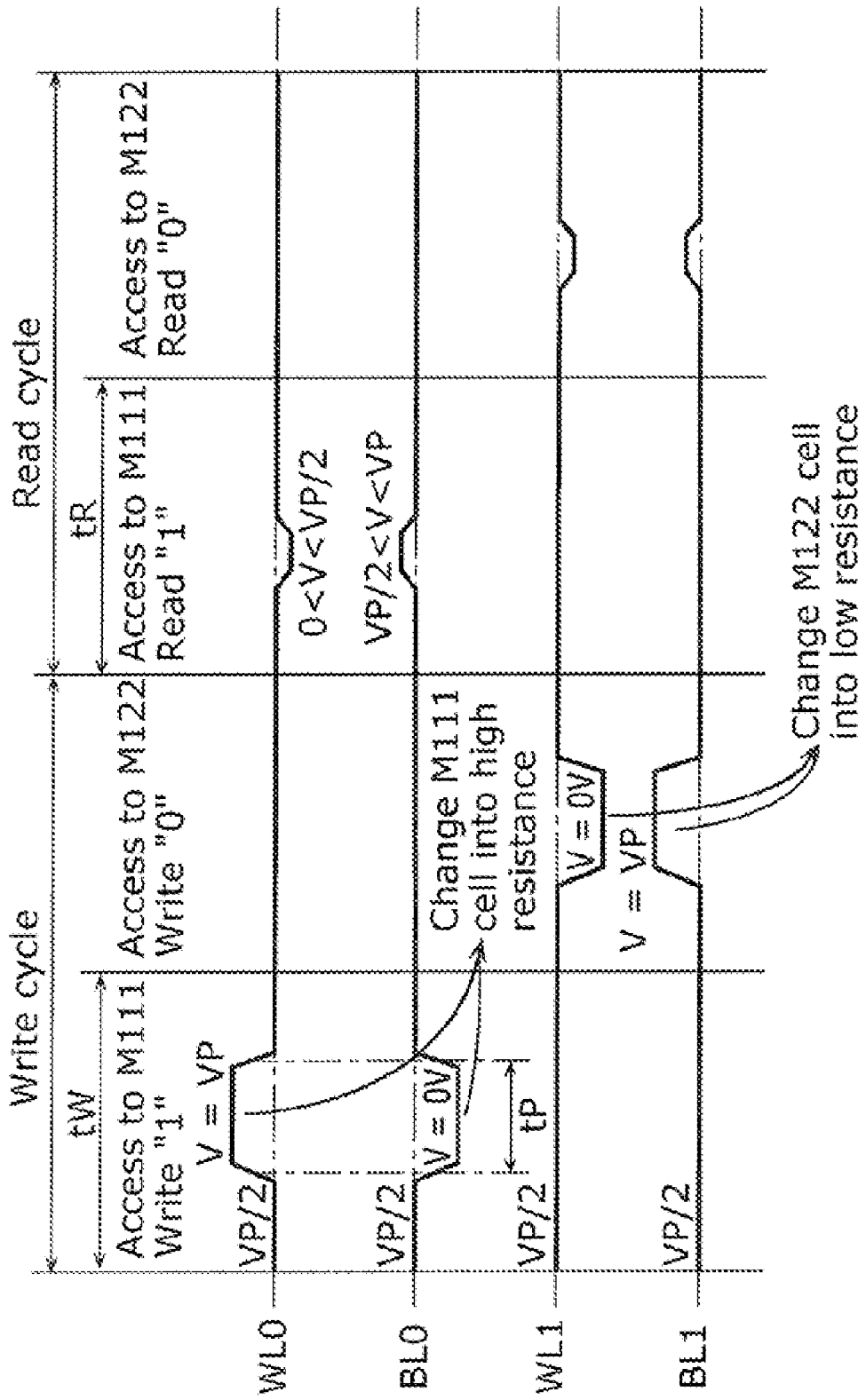
FIG. 28 is a timing diagram showing example operations of the nonvolatile memory device according to Embodiment 2 of the present invention.

FIG. 28 is a timing diagram showing example operations of the nonvolatile memory device 200 according to Embodiment 2 of the present invention. It is to be noted that, here, the example operations are shown for when data "1" is assigned to the case where the variable resistance layer 214 is in a high resistance state and data "0" is assigned to the case where the variable resistance layer 214 is in a low resistance state. Moreover, for the sake of convenience of description, only the cases for writing and reading data with regard to the memory cells M111 and M122 are shown.

A voltage value VP in FIG. 28 denotes a pulse voltage necessary in changing a resistance state of a memory cell including a nonvolatile memory element and a current controlling element. Here, it is preferable that the following relationship is satisfied: VP/2<threshold voltage Vf. This is because it allows suppression of a leakage current which flows through a non-selected memory cell. As a result, it is possible to suppress an excess current supplied to a memory cell for which writing of data is not necessary, and enables further reduction in current consumption. In addition, there is also an advantage that unintended insufficient writing (generally called disturb) into the non-selected memory cell is suppressed.

Furthermore, in FIG. 28, a write cycle time, which is a time necessary for one write cycle, is denoted as tW, and a read cycle time, which is a time necessary for one read cycle, is denoted as tR.

In a write cycle for the memory cell M111, a pulse voltage VP having a pulse width tP is applied to the word line WL0, and a voltage of 0 V is also applied to the bit line BL0 according to the timing of such application. With this, a voltage for writing in the case of writing the data "1" into the memory cell M111 is applied, and accordingly a resistance state of a variable resistance layer of the memory cell M111 changes to the high resistance state. In other words, the data "1" is written into the memory cell M111.

Next, in a write cycle for the memory cell M121, a voltage of 0 V having a pulse width tP is applied to the word line WL1, and a pulse voltage VP is also applied to the bit line BL1 according to the timing of such application. With this, a voltage for writing in the case of writing the data "0" into the memory cell M122 is applied, and accordingly a resistance state of a variable resistance layer of the memory cell M122 changes to the low resistance state. In other words, the data "0" is written into the memory cell M122.

In a read cycle for the memory cell M111, a voltage which is a pulse voltage having a smaller amplitude than the pulse at the time of writing and which has a value larger than 0 V and smaller than VP/2 is applied to the word line WL0. In addition, a voltage which is a pulse voltage having a smaller amplitude than the pulse at the time of writing and which has a value larger than VP/2 and smaller than VP is applied to the bit line BL0 according to the timing of such application. With this, a current corresponding to a resistance value of the variable resistance layer 214 of the memory cell M111 whose resistance state has changed to the high resistance state is outputted, and the data "1" is read by detecting an output current value of the current.

Next, in a read cycle for the memory cell M122, voltages that are the same as those in the preceding read cycle for the memory cell M111 are applied to the word line WL1 and the bit line BL1. With this, a current corresponding to a resistance value of the variable resistance layer 214 of the memory cell M122 whose resistance state has changed to the low resistance state is outputted, and the data "0" is read by detecting an output current value of the current.

The nonvolatile memory device 200 according to the present embodiment includes the nonvolatile memory element 210 which is similar to the nonvolatile memory element 100 according to Embodiment 1 and which allows the favorable resistance change operation, and thus the nonvolatile memory device 200 makes it possible to achieve the stable operation.

Embodiment 3

Next, a nonvolatile memory device according to Embodiment 3 of the present invention shall be described.

The nonvolatile memory device according to Embodiment 3 is a nonvolatile memory device including the nonvolatile memory element 100 according to Embodiment 1, and is a so-called 1T1R nonvolatile memory device in which a unit memory includes one transistor and one nonvolatile memory unit.

(Structure of Nonvolatile Memory Device)

Figure 29:
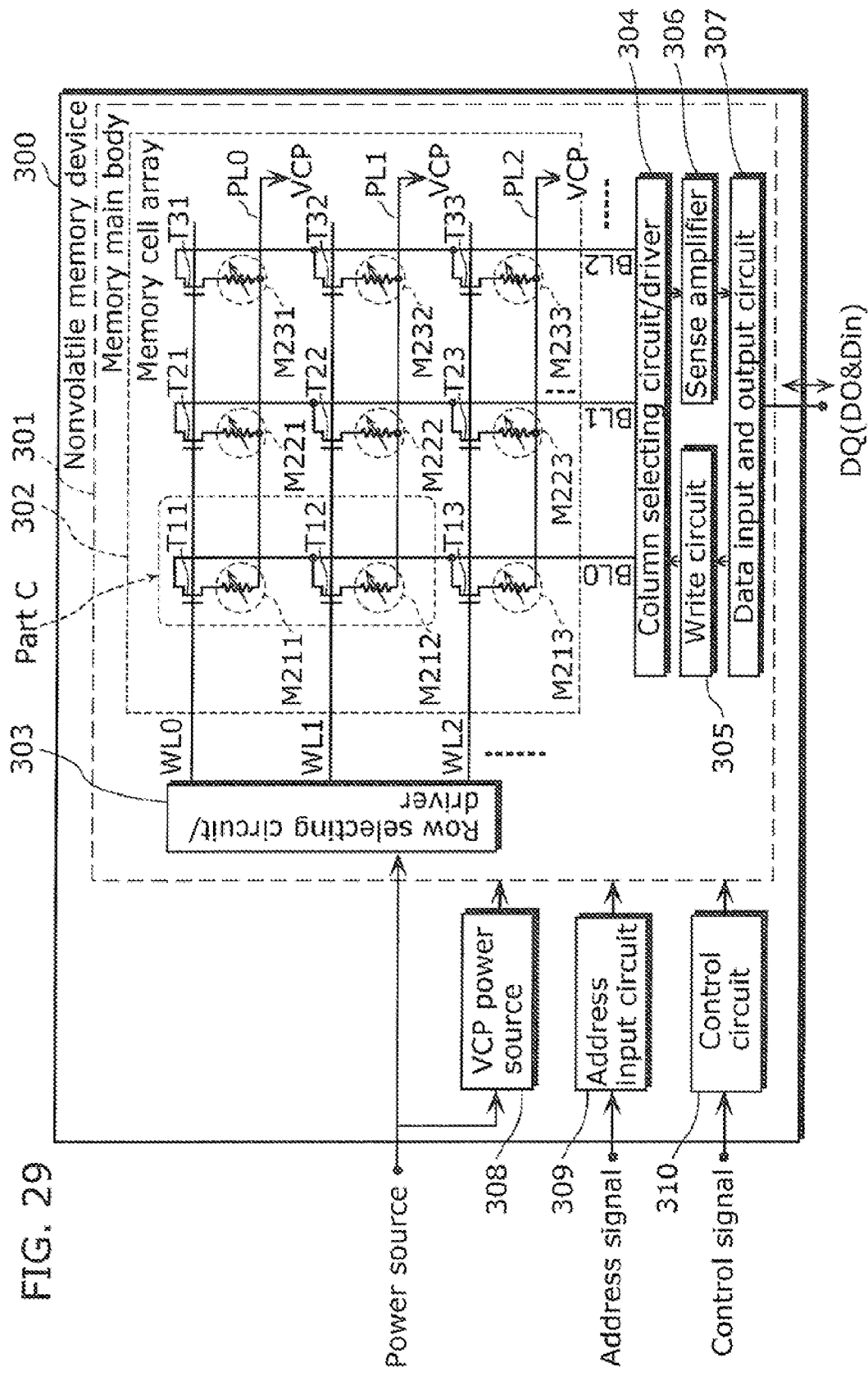
FIG. 29 is a block diagram showing a structure of a nonvolatile memory device according to Embodiment 3 of the present invention.
Figure 30:
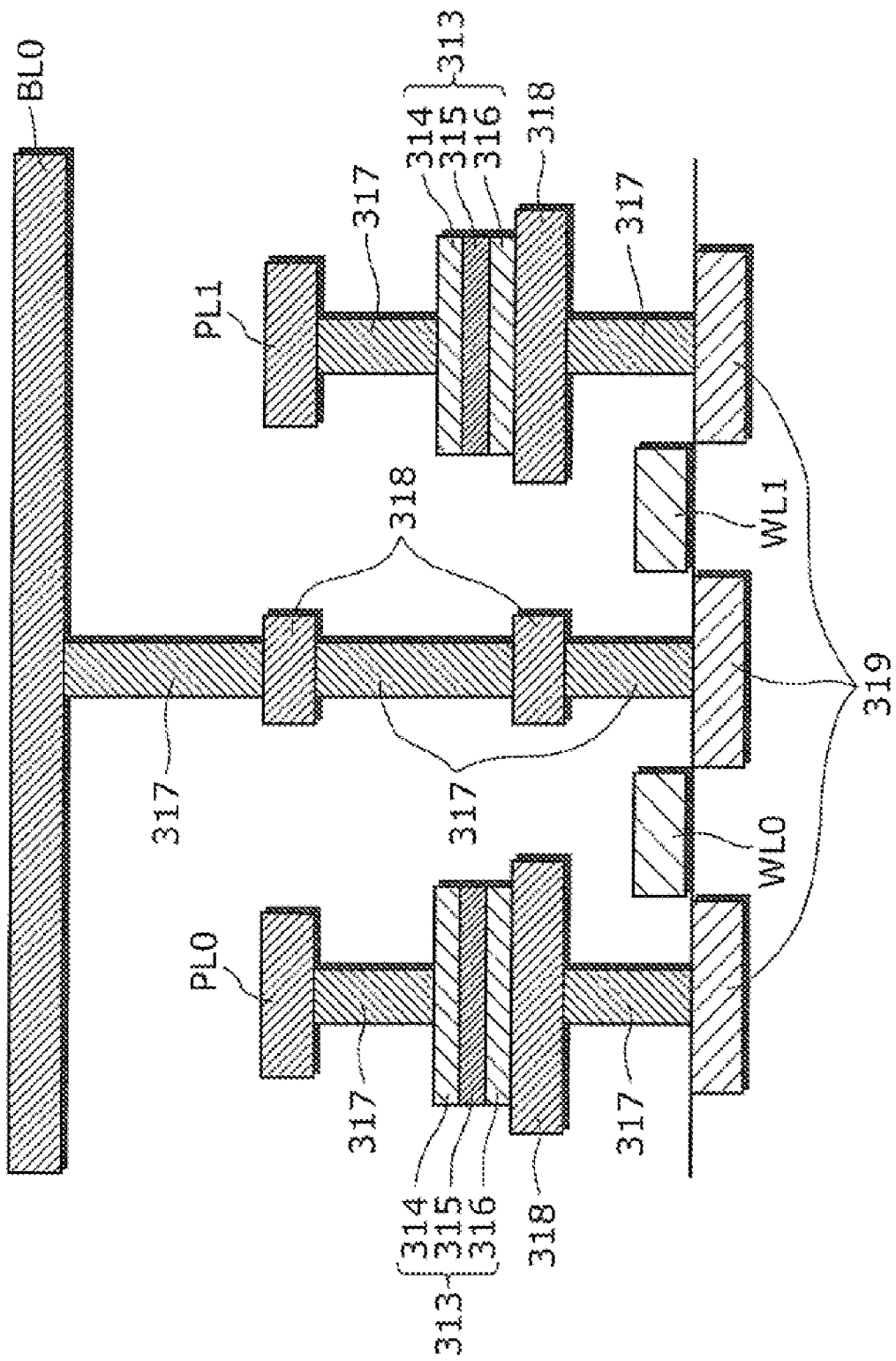
FIG. 30 is a cross-sectional view showing a structure of part C (structure for two bits) shown in FIG. 29.

FIG. 29 is a block diagram showing a structure of a nonvolatile memory element 300 according to Embodiment 3 of the present invention. Furthermore, FIG. 30 is a perspective view showing a structure of part C (physical structure of a memory cell for two bits) shown in FIG. 29.

As shown in FIG. 29, the nonvolatile memory device 300 according to the present embodiment includes a memory main body 301 on a semiconductor substrate. The memory main body 301 includes: a memory cell array 302; a row selection circuit/driver 303, a column selection circuit/driver 304; a write circuit 305 for writing data; a sense amplifier 306 which detects an amount of current flowing in a selected bit line and determines whether the data indicates "1" or "0"; and a data input and output circuit 307 which performs input and output processing of input and output data via a terminal DQ.

In addition, the nonvolatile memory device 300 further includes: a cell plate power source (VCP power source) 308; an address input circuit 309 which receives address signals inputted from the outside; and a control circuit 310 which controls operations of the memory main body 301 based on a control signal Inputted from the outside.

The memory cell array 302 includes: word lines WL0, WL1, WL2, . . . and bit lines BL0, BL1, BL2, . . . which are formed above the semiconductor substrate and arranged to cross with each other; transistors (e.g., NMOS transistors) T11, T12, T134, T22, T23, T31, T32, T33, . . . each of which is provided at a crosspoint between corresponding ones of the word lines WL0, WL1, WL2, . . . and the bit lines BL0, BL1, BL2, . . . ; and memory cells M211, M212, M213, M221, M222, M223, M231, M232, M233 . . . (hereinafter, referred to as "memory cells M211, M212, . . . " which correspond to the transistors T11, T12, . . . on a one-on-one basis.

In addition, the memory cell array 302 includes plate lines PL0, PL1, PL2, . . . which are arranged parallel to the word lines WL0, WL1, WL2, . . . .

As shown in FIG. 30, the bit line BL0 is provided above the word lines WL0 and WL1, and the plate lines PL0 and PL1 are provided between the word lines WL0 and WL1, and the bit line BL0.

Here, each of the memory cells M211, M212, . . . corresponds to the nonvolatile memory element 100 according to Embodiment 1. More specifically, the nonvolatile memory element 313 shown in FIG. 30 corresponds to each of the memory cells M211, M212, . . . shown in FIG. 29, and includes an upper electrode 314, a variable resistance layer 315, and a lower electrode 316. The upper electrode 314, the variable resistance layer 315, and the lower electrode 316 correspond respectively to the first electrode layer 103, the variable resistance layer 104, and the second electrode layer 105 included in the nonvolatile memory element 100 according to Embodiment 1 shown in FIG. 1. Thus, the variable resistance layer 315 is formed in the same manner as the variable resistance layer 104 described in Embodiment 1.

It is to be noted that, in FIG. 30, the reference numeral 317 indicates a plug layer, the reference numeral 318 indicates a metal wire layer, and the reference numeral 319 indicates a source region and a drain region.

As shown in FIG. 29, drains of the transistors T11, T12, T13, . . . are connected to the bit line BL0, drains of the transistors T21, T22, T23, . . . are connected to the bit line BL1, and drains of the transistors T31, T32, T33, . . . are connected to the bit line BL2.

Moreover, gates of the transistors T11, T21, T31, . . . are connected to the word line WL0, gates of the transistors T12, T22, T32, . . . are connected to the word line WL1, and gates of the transistors T13, T23, T33, . . . are connected to the word line WL2.

Furthermore, sources of the transistors T11, T12, . . . are connected to the corresponding memory cells M211, M212, . . . .

Moreover, the memory cells M211, M221, M231, . . . are connected to the plate line PL0, the memory cells M212, M222, M232, . . . are connected to the plate line PL1, and the memory cells M213, M223, M233, . . . are connected to the plate line PL2.

The address input circuit 309 receives address signals from an external circuit (not shown), and outputs row address signals to the row selection circuit/driver 303 and column address signals to the column selection circuit/driver 304, based on the address signals. Here, the address signals are signals indicating an address of a specific memory cell to be selected from among the memory cells M211, M212, . . . included in the memory cell array 302. In addition, the row address signals are signals indicating an address of a row which is a part of the address indicated by the address signals, and the column address signals are signals indicating an address of a column which is a part of the address indicated by the address signals.

In a data write cycle, the control circuit 310 outputs, to the write circuit 305, a write command signal instructing application of voltage for writing, according to input data Din inputted to the data input and output circuit 307. On the other hand, in a data read cycle, the control circuit 310 outputs, to the column selection circuit 304, a read command signal instructing application of voltage for reading.

The row selection circuit/driver 303 receives the row address signals outputted from the address input circuit 309, selects one of the word lines WL0, WL1, WL2, . . . according to the row address signals, and applies a predetermined voltage to the selected word line. In other words, the row selection circuit/driver 303 is an example of a selection circuit which selects at least one of the nonvolatile memory elements included in the memory cell array 302.

Furthermore, the column selection circuit/driver 304 receives the column address signals outputted from the address input circuit 309, selects one of the bit lines BL0, BL1, BL2, . . . according to the column address signals, and applies a voltage for writing or a voltage for reading to the selected bit line. In other words, the column selection circuit/driver 304 is the example of the selection circuit which selects the at least one of the nonvolatile memory elements included in the memory cell array 302.

When receiving the write command signal outputted from the control circuit 310, the write circuit 305 outputs, to the column selection circuit 304, a signal instructing application of voltage for writing to the selected bit line. To put it differently, the write circuit 305 is an example of a write circuit which writes data by applying a voltage to the nonvolatile memory element (here, the memory cell) selected by the selection circuit (the row selection circuit/driver 303 and the column selection circuit/driver 304).

Moreover, in the data read cycle, the sense amplifier 306 detects an amount of current flowing in the selected bit line to be read, and determines whether data indicates "1" or "0". The resultant output data DO is outputted to the external circuit via the data input and output circuit 307. Stated differently, the sense amplifier 306 is an example of a readout circuit which reads data by detecting a resistance value of the nonvolatile memory element which is included in the memory cell selected by the selection circuit (the row selection circuit/driver 303 and the column selection circuit/driver 304).

It is to be noted that in the case of the 1T1R nonvolatile memory device including one transistor and one nonvolatile memory unit according to the present embodiment, one transistor is required for every memory cell, and thus the storage capacity of the nonvolatile memory device is smaller than that of the crosspoint nonvolatile memory device according to Embodiment 2. However, a current controlling element such as a diode is not necessary, and thus there are advantages that the 1T1R nonvolatile memory device can be easily incorporated into a CMOS process and that it is easy to control the operations of the same.

(Example Operations of Nonvolatile Memory Device)

Next, example operations of the nonvolatile memory device 300 according to the present embodiment in a write cycle when data is written and in a read cycle when data is read shall be described with reference to a timing diagram shown in FIG. 31.

Figure 31:
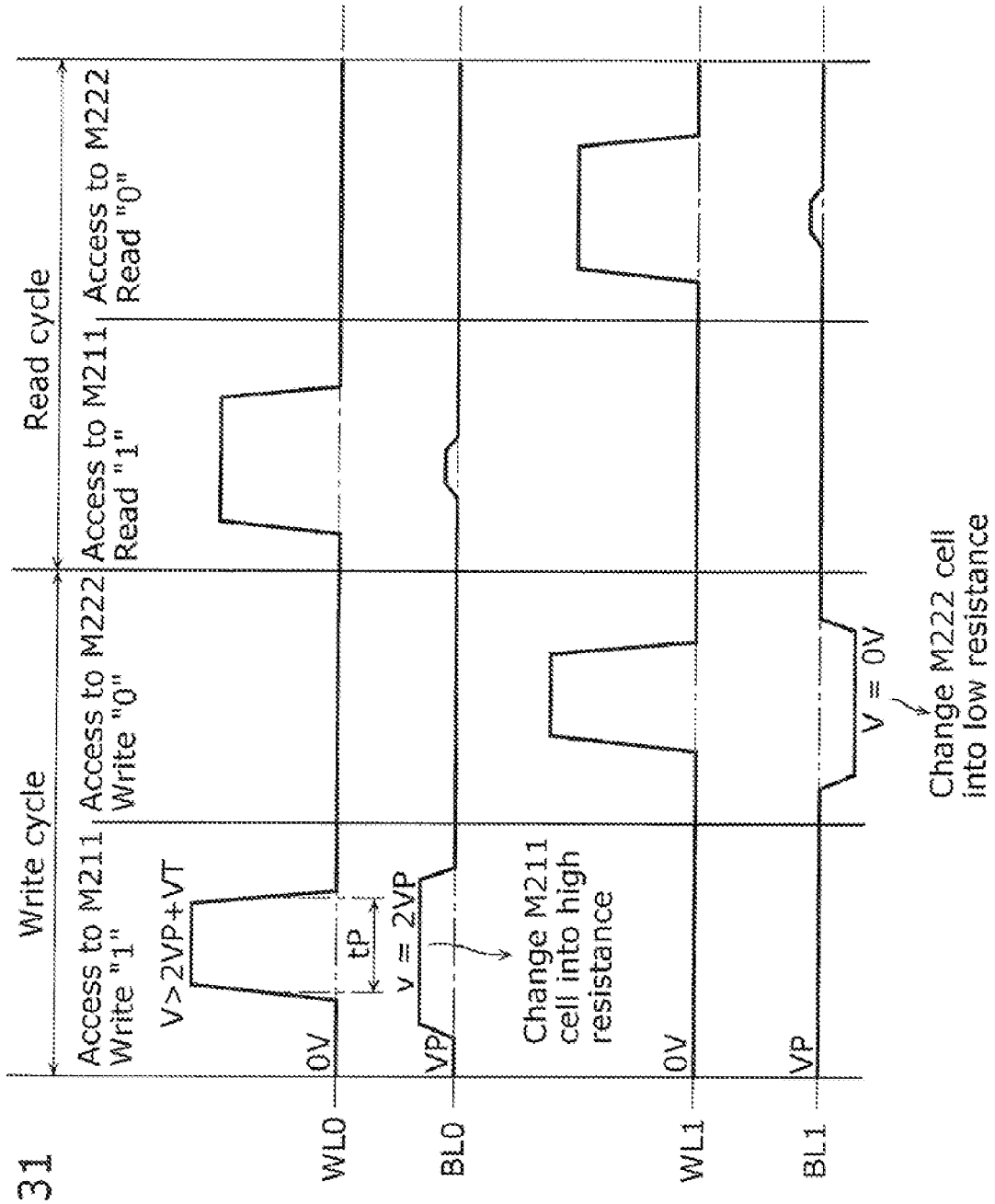
FIG. 31 is a timing diagram showing example operations of the nonvolatile memory device according to Embodiment 3 of the present invention.

FIG. 31 is a timing diagram showing example operations of the nonvolatile memory device 300 according to Embodiment 3 of the present invention. It is to be noted that, here, the example operations are shown for when data "1" is assigned to the case where the variable resistance layer 315 is in a high resistance state and data "0" is assigned to the case where the variable resistance layer 315 is in a low resistance state. Moreover, for the sake of convenience of description, only the cases for writing and reading data with regard to the memory cells M211 and M222 are shown.

In FIG. 31, a voltage value VP denotes a pulse voltage necessary in changing a resistance state of a variable resistance element, and a voltage value VT denotes a threshold voltage of a transistor. The voltage VP is always applied to the plate lines, and the bit lines are pre-charged with the voltage VP when they are not selected.

In a write cycle for the memory cell M211, a pulse voltage (voltage larger than (2VP+threshold voltage VT of transistor)) having a pulse width tP is applied to the word line WL0, and the transistor T11 turns on. Then, a pulse voltage 2VP is applied to the bit line BL0 according to the timing of such application. With this, a voltage for writing in the case of writing the data "1" into the memory cell M211 is applied, and accordingly a resistance state of a variable resistance layer of the memory cell M211 changes to the high resistance state. In other words, the data "1" is written into the memory cell M211.

Next, in a write cycle for the memory cell M222, a pulse voltage (voltage larger than (2VP+threshold voltage VT of transistor)) having a pulse width tP is applied to the word line WL1, and the transistor T22 turns on. A voltage of 0 V is applied to the bit line BL1 according to the timing of such application. With this, a voltage for writing in the case of writing the data "0" into the memory cell M222 is applied, and accordingly a resistance state of a variable resistance layer of the memory cell M222 changes to the low resistance state. In other words, the data "0" is written into the memory cell M222.

In a read cycle for the memory cell M211, a predetermined voltage is applied to the word line WL0 so that the transistor T11 turns on, and a pulse voltage having a smaller amplitude than the pulse at the time of writing is applied to the bit line BL0 according to the timing of such application. With this, a current corresponding to a resistance value of the variable resistance layer of the memory cell M211 whose resistance state has changed to the high resistance state is outputted, and the data "1" is read by detecting an output current value of the current.

Next, in a read cycle for the memory cell M222, voltages that are the same as those in the preceding read cycle for the memory cell M211 are applied to the word line WL1 and the bit line BL1. With this, a current corresponding to a resistance value of the variable resistance layer of the memory cell M222 whose resistance state has changed to the low resistance state is outputted, and the data "0" is read by detecting an output current value of the current.

In the same manner as the case of Embodiment 2, the nonvolatile memory device 300 according to the present embodiment also includes the nonvolatile memory element 313 which is similar to the nonvolatile memory element 100 according to Embodiment 1 and which allows the favorable resistance change operation, and thus the nonvolatile memory device 300 makes it possible to achieve the stable operation.

INDUSTRIAL APPLICABILITY

A nonvolatile memory element and a nonvolatile memory device according to the present invention are useful as a memory element used for various electric devices, and especially as a memory element and a memory device that operate at a low breakdown voltage, for example, as a memory element and a memory device used for various electric devices such as digital appliances, memory cards, personal computers, and mobile phones.

[Reference Signs List]

| | |
|---|---|
| 100 | Nonvolatile memory element |
| 101 | Substrate |
| 102 | Oxide layer |
| 103 | First electrode layer |
| 104 | Variable resistance layer |
| 104a | First oxide layer |
| 104b | Second oxide layer |
| 105 | Second electrode layer |
| 106 | Photoresist pattern |
| 107 | Element region |
| 200 | Nonvolatile memory device |
| 201 | Memory main body |
| 202 | Memory cell array |
| 203 | Row selection circuit/driver |
| 203 | Column selection circuit/driver |
| 205 | Write circuit |
| 206 | Sense amplifier |
| 207 | Data input and output circuit |
| 208 | Address input circuit |
| 209 | Control circuit |
| 210 | Nonvolatile memory element |
| 211 | Upper wire |
| 212 | Lower wire |
| 213 | Upper electrode |
| 214 | Variable resistance layer |

-continued

[Reference Signs List]

| | |
|---|---|
| 215 | Inner electrode |
| 216 | Current controlling element |
| 217 | Lower electrode |
| 300 | Nonvolatile memory device |
| 301 | Memory main body |
| 302 | Memory cell array |
| 303 | Row selection circuit/driver |
| 304 | Column selection circuit |
| 305 | Write circuit |
| 306 | Sense amplifier |
| 307 | Data input and output circuit |
| 308 | VCP power source |
| 308 | Address input circuit |
| 319 | Control drcuit |
| 313 | Nonvolatile memory element |
| 313 | Upper electrode |
| 315 | Variable resistance layer |
| 316 | Lower electrode |
| BL0, BL1, ... | Bit line |
| M111, M112, ... | Memory cell |
| M212, M212, ... | Memory cell |
| PL0, PL1, ... | Plate line |
| T11, T12, ... | Transistor |
| WL0, WL1, ... | Word line |

The invention claimed is:

1. A variable resistance nonvolatile memory element comprising:
 a first electrode;
 a second electrode; and
 a variable resistance layer which is placed between said first electrode and said second electrode, and whose resistance state reversibly changes between a high resistance state and a low resistance state based on a polarity of a voltage applied between said first electrode and said second electrode,
 wherein said nonvolatile memory element has a characteristic of changing into a state where the resistance state can change after an initial breakdown is performed when said nonvolatile memory element is in an initial state, the initial breakdown being for applying, to said nonvolatile memory element, a breakdown voltage with a load element connected to said nonvolatile memory element, and the initial state being a state where said nonvolatile memory element has a resistance value higher than a resistance value of said nonvolatile memory element of which said variable resistance layer is in the high resistance state,
 said variable resistance layer has a stacked structure of at least a first oxide layer and a second oxide layer, said first oxide layer including an oxide of a first transition metal, and said second oxide layer including an oxide of a second transition metal which is different from said first transition metal, and
 a degree of oxygen deficiency of said first oxide layer is greater than a degree of oxygen deficiency of said second oxide layer, a standard electrode potential of said second transition metal is lower than a standard electrode potential of said first transition metal, and at least one of the following conditions is satisfied: (1) a dielectric constant of said second oxide layer is larger than a dielectric constant of said first oxide layer; and (2) a band gap of said second oxide layer is smaller than a band gap of said first oxide layer.

2. The nonvolatile memory element according to claim 1, wherein both of the following conditions are satisfied: (1) the dielectric constant of said second oxide layer is larger than the dielectric constant of said first oxide layer; and (2) the band gap of said second oxide layer is smaller than the band gap of said first oxide layer.

3. The nonvolatile memory element according to claim 1, wherein said second electrode is formed in contact with said second oxide layer, and
a standard electrode potential of a material of said second electrode is higher than the standard electrode potential of said second transition metal.

4. The nonvolatile memory element according to claim 3, wherein the standard electrode potential of said first transition metal is lower than the standard electrode potential of the material of said second electrode.

5. The nonvolatile memory element according to claim 1, wherein a thickness of said second oxide layer is less than a thickness of said first oxide layer.

6. The nonvolatile memory element according to claim 1, wherein said second transition metal is Ti, Sr, or Nb.

7. The nonvolatile memory element according to claim 6, wherein said first transition metal is Ta.

8. The nonvolatile memory element according to claim 1, further comprising
a load element which is electrically connected to said nonvolatile memory element.

9. The nonvolatile memory element according to claim 8, wherein said load element is a fixed resistor, a transistor, or a diode.

10. A nonvolatile memory device comprising:
a semiconductor substrate;
first wires formed parallel to each other on said semiconductor substrate;
second wires formed above said first wires so as to be parallel to each other on a plane parallel to a principal plane of said semiconductor substrate and to three-dimensionally cross said first wires;
a memory cell array which includes nonvolatile memory elements including the nonvolatile memory element of claim 1, the nonvolatile memory elements each being provided to correspond to one of crosspoints between said first wires and said second wires;
a selection circuit which selects at least one of the nonvolatile memory elements included in said memory cell array;
a write circuit which writes data by applying a voltage to the selected nonvolatile memory element; and
a readout circuit which reads the data by detecting a resistance value of the selected nonvolatile memory element.

11. The nonvolatile memory device according to claim 10, further comprising
a current controlling element which is electrically connected to each of the nonvolatile memory elements.

12. A nonvolatile memory device comprising:
a semiconductor substrate;
word lines and bit lines which are formed above said semiconductor substrate;
transistors each of which is connected to corresponding ones of said word lines and said bit lines;
a memory cell array which includes nonvolatile memory elements including the nonvolatile memory element of claim 1, the nonvolatile memory elements being provided to correspond to said transistors on a one-on-one basis;
a selection circuit which selects at least one of the nonvolatile memory elements included in said memory cell array;
a write circuit which writes data by applying a voltage to the selected nonvolatile memory element; and
a readout circuit which reads the data by detecting a resistance value of the selected nonvolatile memory element.

* * * * *